US006563397B1

(12) United States Patent
Jang

(10) Patent No.: US 6,563,397 B1
(45) Date of Patent: May 13, 2003

(54) DIELECTRIC FILTER FOR FILTERING OUT UNWANTED HIGHER ORDER FREQUENCY HARMONICS AND IMPROVING SKIRT RESPONSE

(76) Inventor: Sei-Joo Jang, C/O S. M. Choi Dongbu Haeoreum, Apt. 101-1109, 716 Yoksam-Dong, Kangnam-Ku Seoul (KR)

( * ) Notice: Subject to any disclaimer, the term of this patent is extended or adjusted under 35 U.S.C. 154(b) by 0 days.

(21) Appl. No.: 09/697,452

(22) Filed: Oct. 26, 2000

(51) Int. Cl.[7] ........ H03P 5/12
(52) U.S. Cl. ........ 333/134; 333/202
(58) Field of Search ........ 333/134, 206, 333/202, 222

(56) References Cited

U.S. PATENT DOCUMENTS 5,578,975 A * 11/1996 Kazama et al. ............. 333/202

FOREIGN PATENT DOCUMENTS

JP 59-185404 * 10/1984 ........... H01P/1/212
JP 1-53604 * 3/1989 ........... H01P/1/212
JP 9-205302 * 8/1997 ............. H01P/1/20

* cited by examiner

*Primary Examiner*—Robert Pascal
*Assistant Examiner*—Joseph Chang
(74) *Attorney, Agent, or Firm*—John J. Elnitski, Jr.

(57) ABSTRACT

The present invention is a filter and a method of making a filter to remove unwanted frequency harmonics associated with current filters. The filter is made up of resonators, such that the filter resonates a design frequency. Whereby, at least two resonators are coupled together between an input and an output and at least one of the resonators is of a different design from other resonators, such that the resonator of a different design resonates the same design frequency as the other resonators and resonates different higher order harmonic frequencies than the other resonators. The present invention also provides methods of improving skirt response for a filter, as well as other response properties of the filter. One way to improve the filter's properties is where at least one of the resonators in a filter is reversed in orientation as compared to the other resonators. Another way is where at least one of the resonators is reversed in orientation electronically by employing electrode coupling on a top and bottom surface of the filter.

14 Claims, 37 Drawing Sheets (a) RE-ENTRANT CAVITY TRANSMISSION RESPONSE
(b) COAXIAL CAVITY TRANSMISSION RESPONSE $\eta=2$ $\eta=3$

DIELECTRIC FILTER FOR FILTERING OUT UNWANTED HIGHER ORDER FREQUENCY HARMONICS AND IMPROVING SKIRT RESPONSE

BACKGROUND

It is known to use two or more coaxial dielectric ceramic resonators coupled together to create a filter for use in mobile and portable radio transmitting and receiving devices, such as microwave communication devices. Likewise, two or more re-entrant dielectric ceramic resonators can be coupled together to form such a filter. Resonators in a filter are designed to resonate just one frequency and this frequency is known as the resonate frequency of the resonator. FIG. 1 shows an example of a three-pole filter using three quarter-wavelength coaxial dielectric ceramic resonators coupled together. The coupling method shown in FIG. 1 is a known technique of coupling resonators by providing an aperture or IRIS between the resonators. IRIS is a passage between resonators that allows electrical and magnetic fields of the resonate frequency to pass from one resonator to another. The filter includes an input and an output. The input is usually radio frequencies signals from an antenna or signal generator. The filter only allows the resonate frequency of the resonators and its harmonics to pass through the filter and on to the output. The number of resonators used determines the characteristics of the passing signal, such as bandwidth, insertion loss, skirt response and spurious frequency response. The disadvantage to such filters is that the resonators not only allow the first harmonic of design frequency to pass, but also allow the other associated higher order harmonics of that frequency to pass through the filter. These higher order harmonics are known to interfere with other electronic devices.

It is an object of the present invention to a filter to prevent the passage of higher order harmonics of a design frequency.

It is an object of the present invention to provide a method of coupling resonators.

SUMMARY OF THE INVENTION

The present invention is a filter and a method of making a filter to remove unwanted frequency harmonics associated with current filters. The filter is made up of resonators, such that the filter resonates a design frequency. Whereby, at least two resonators are coupled together between an input and an output and at least one of the resonators is of a different design from other resonators, such that the resonator of a different design resonates the same design frequency as the other resonators and resonates different higher order harmonic frequencies than the other resonators. The present invention also provides methods of improving skirt response for a filter, as well as other response properties of the filter. One way to improve the filter's properties is where at least one of the resonators in a filter is reversed in orientation as compared to the other resonators. Another way is where at least one of the resonators is reversed in orientation electronically by employing electrode coupling on a top and bottom surface of the filter.

DETAILED DESCRIPTION OF THE INVENTION

Figure 1:
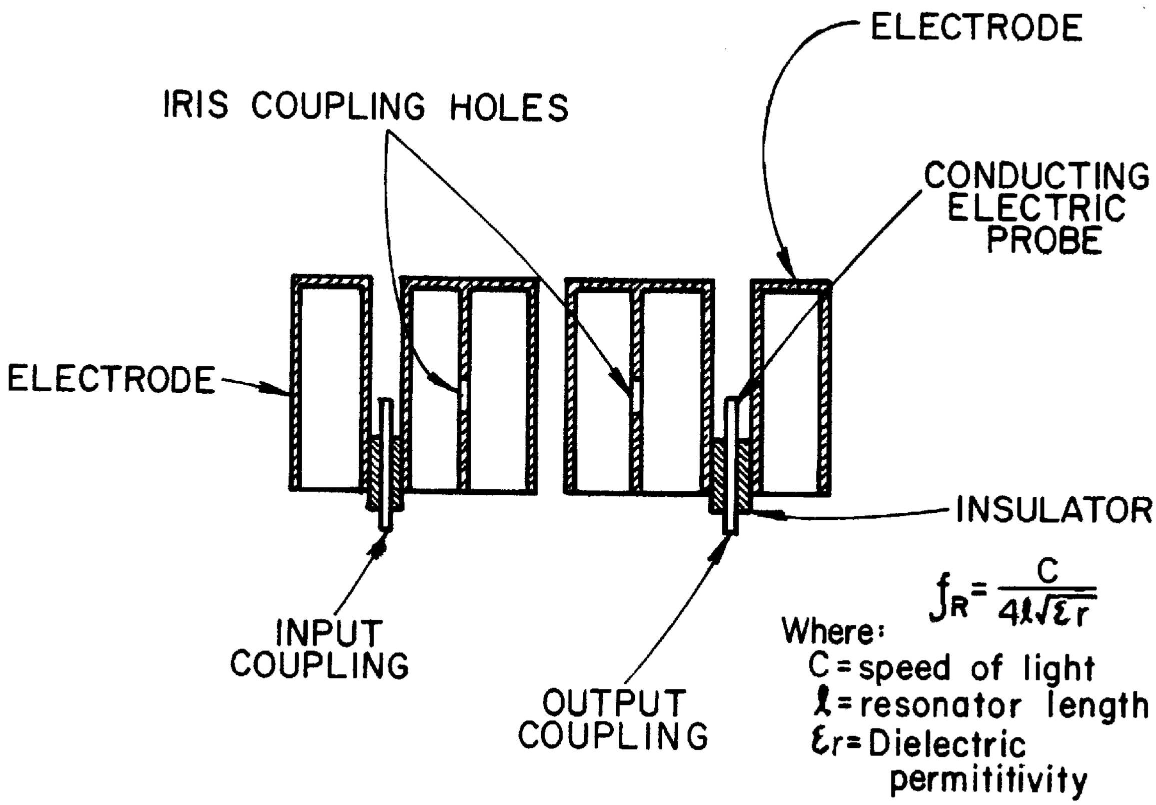
FIG. 1 is a schematic cross-sectional view of a three-pole filter using coaxial resonators according to prior art.
Figure 2:
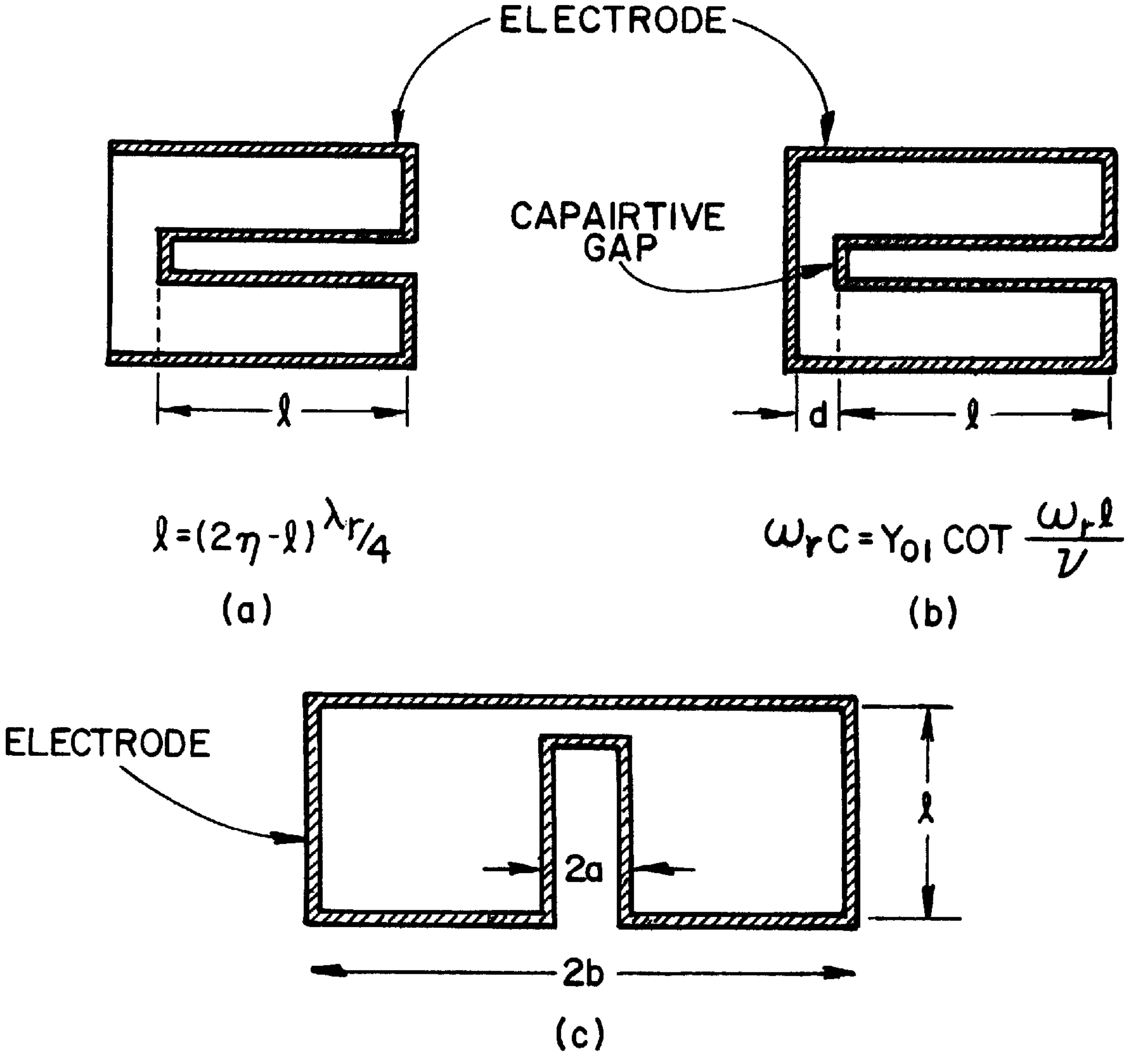
FIG. 2 is a schematic cross-sectional view of three different re-entrant resonators according to prior art.
Figure 3:
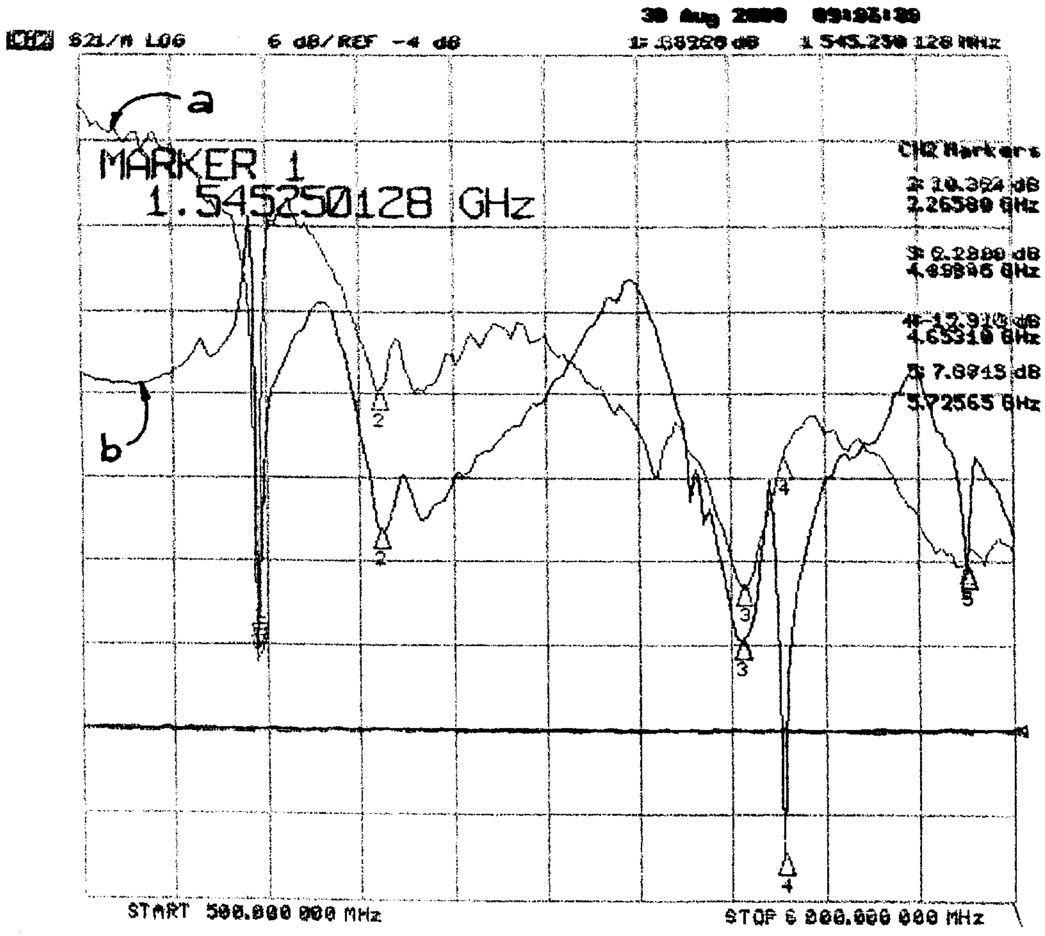
FIG. 3 is a plot of a coaxial dielectric ceramic resonator and a re-entrant dielectric ceramic resonator designed for the same resonate frequency.

The present invention is a filter and a method of making a filter to remove unwanted frequency harmonics associated with current filters of the prior art. The present invention provides methods of improving skirt response for a filter, as well as other response properties of the filter. The present invention is also a method of coupling resonators. Coaxial dielectric ceramic resonators are designed to resonate a frequency based on the equation shown in FIG. 1. FIG. 2 shows three other different design examples of dielectric ceramic resonators along with their associated resonate frequency design equation. The resonators of FIG. 2 are sometimes referred to as re-entrant dielectric ceramic resonators. FIG. 3 shows a plot of a coaxial dielectric ceramic resonator and a re-entrant dielectric ceramic resonator designed for the same resonate frequency. As can be seen from FIG. 3, the higher order harmonics frequencies for the coaxial and re-entrant resonators are different. A resonator of a particular design will only allow the design frequency and the higher order harmonic frequencies associated with the resonator to pass to the next resonator in a filter. Since the higher order harmonic frequencies are not the same, as shown by the plot in FIG. 3, the harmonic frequencies of a coaxial dielectric ceramic resonator will not pass through a re-entrant dielectric ceramic resonator designed for the same resonate frequency. It is also true that the higher order harmonic frequencies of the re-entrant dielectric ceramic resonator will not pass through a coaxial dielectric ceramic resonator designed for the same resonate frequency. Further, the higher order harmonic frequencies of a re-entrant dielectric ceramic resonator will not pass through a different re-entrant dielectric ceramic resonator having a different resonate frequency design equation, yet designed for the same resonate frequency. Therefore, making a filter from different types of dielectric ceramic resonators that resonate the same first harmonic of a desired frequency provides a filter that outputs only that first harmonic of the desired frequency.

Figure 4:
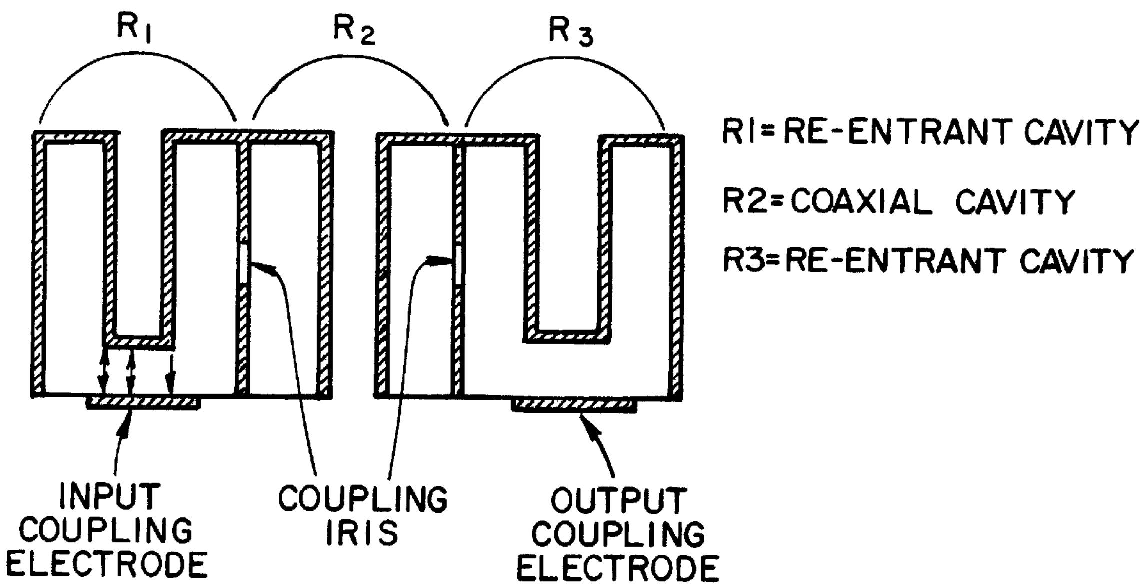
FIG. 4 is a schematic cross-sectional view of a three-pole filter using coaxial and re-entrant resonators coupled by using IRIS coupling according to present invention.
Figure 5:
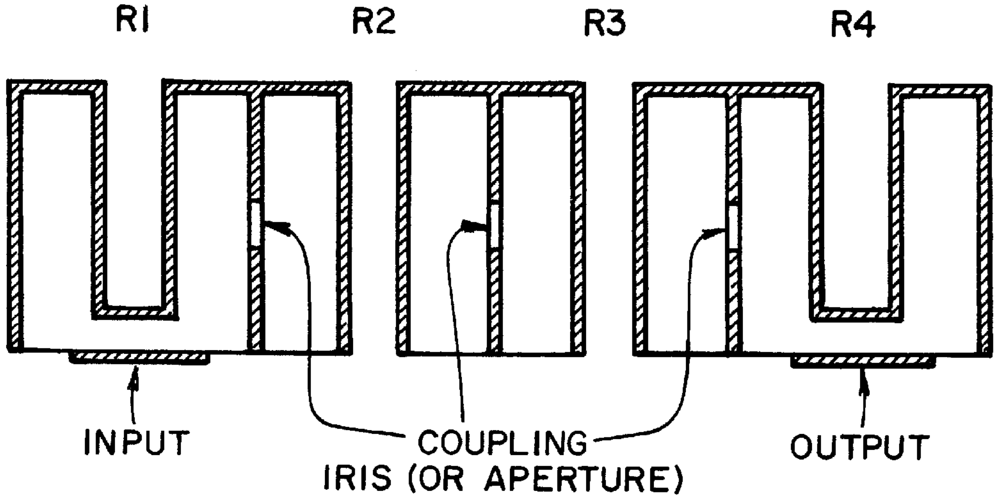
FIG. 5 is a schematic cross-sectional view of a four-pole filter using coaxial and re-entrant resonators coupled by using IRIS coupling according to present invention.
Figure 6:
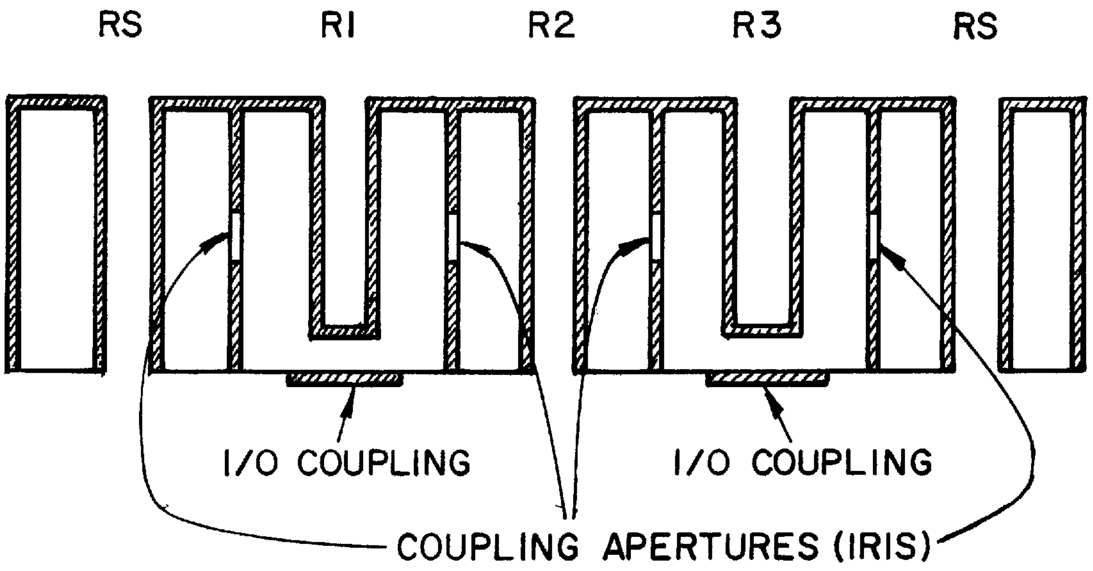
FIG. 6 is a schematic cross-sectional view of a three-pole filter of FIG. 4 with the addition of two coaxial resonators to improve Skirt response according to present invention.
Figure 7:
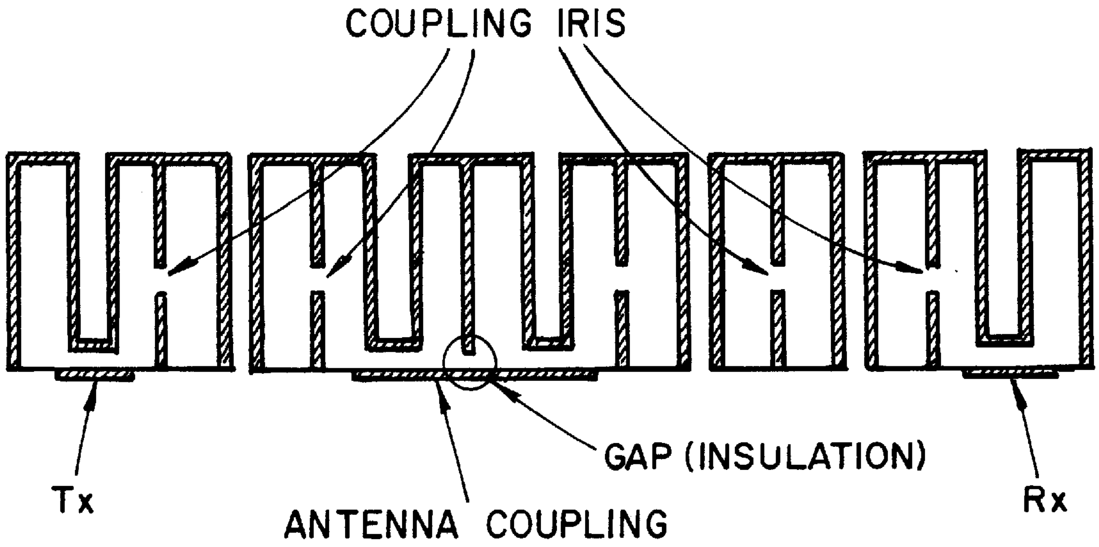
FIG. 7 is a schematic cross-sectional view of a duplexer filter employing electrode coupling for an antenna according to present invention.
Figure 8:
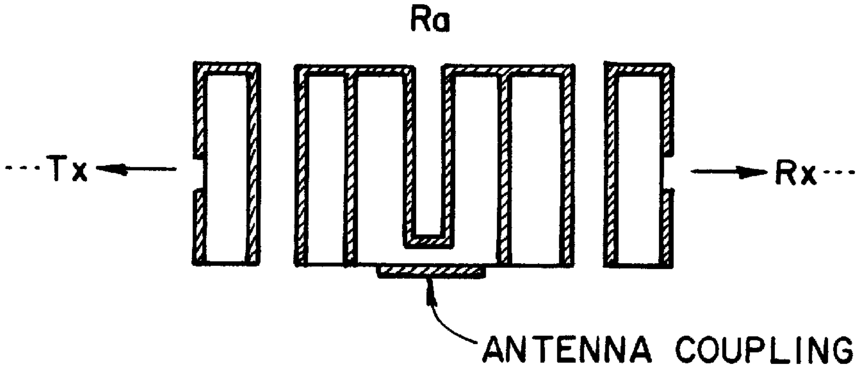
FIG. 8 is a schematic cross-sectional view of another duplexer filter employing electrode coupling for an antenna according to present invention.
Figure 9:
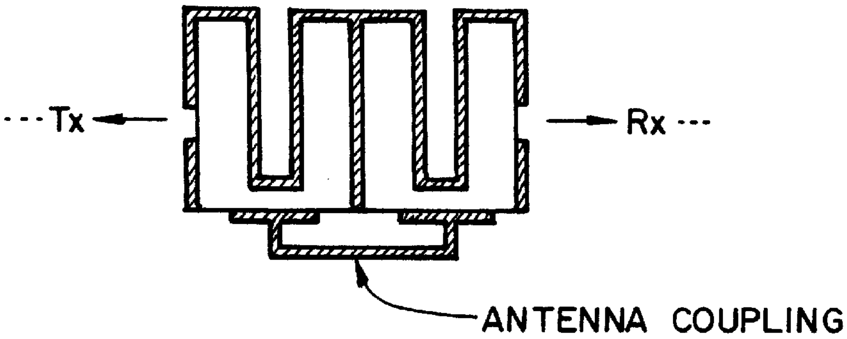
FIG. 9 is a schematic cross-sectional view of another duplexer filter employing electrode coupling for an antenna according to present invention.
Figure 10:
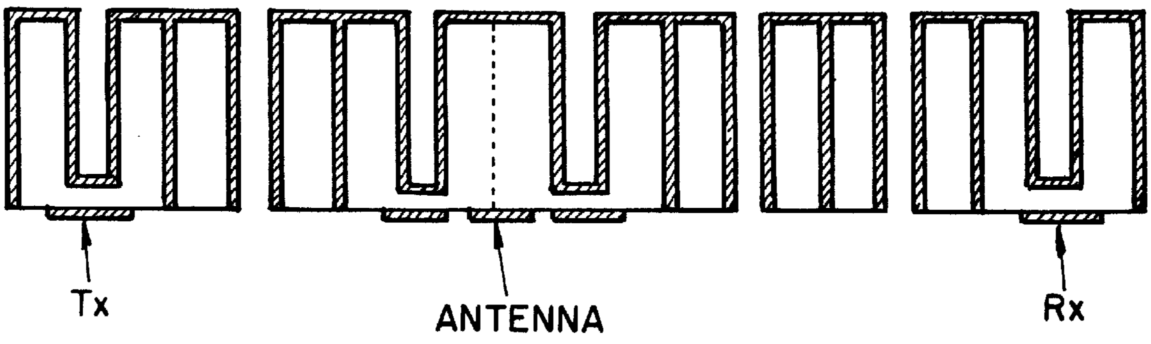
FIG. 10 is a schematic cross-sectional view of another duplexer filter employing electrode coupling for an antenna according to present invention.
Figure 11:
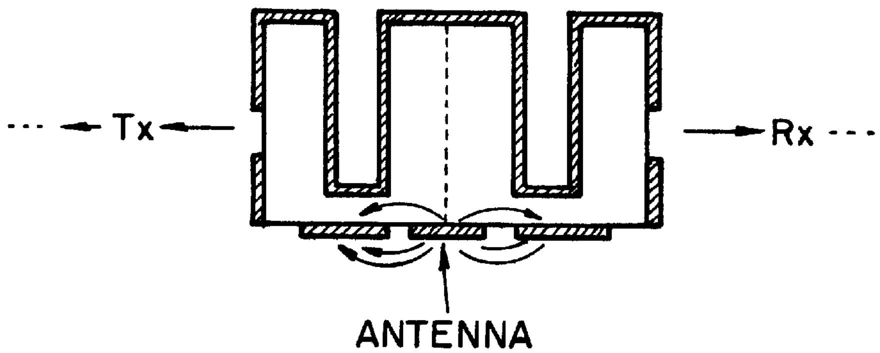
FIG. 11 is a schematic cross-sectional view of another duplexer filter employing electrode coupling for an antenna according to present invention.
Figure 12:
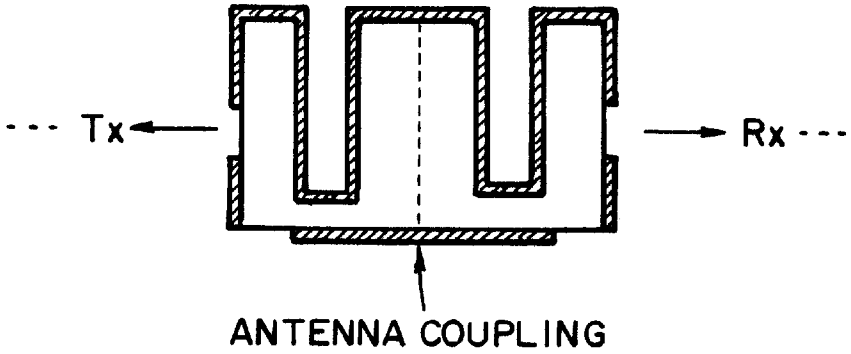
FIG. 12 is a schematic cross-sectional view of another duplexer filter employing electrode coupling for an antenna according to present invention.

The following are examples of different filters configurations using the above disclosure. All of the examples employ a coaxial dielectric ceramic resonator shown in FIG. 1 and the re-entrant dielectric ceramic resonator shown in FIG. 2, whereby both resonators resonate the same first harmonic frequency. These examples depict schematically the coaxial and re-entrant resonators of a filter and are not specific examples of resonators or filters. The examples shown can be interchanged with other combinations of coaxial and re-entrant resonators, so long as they all resonate the same first harmonic frequency. The filter configurations shown as examples can be made up of a combination of individual resonators to act as a filter or multiple resonators formed from a single block of material to act as a filter. FIG. 4 shows a three-pole filter having two re-entrant resonators flanking a coaxial resonator. Note that electrode coupling is employed between the reentrant resonators and input and output electrodes, whereas FIG. 1 shows electric probes in the coaxial resonators for input and output. This simplifies surface mounting of the filter to a circuit board. FIG. 5 shows a four-pole configuration. FIG. 6 shows the three-pole configuration of FIG. 4 flanked by two coaxial resonators to improve Skirt response of the filter. Resonators added to the ends of a filter to improve Skirt response are referred to as band stop resonators. FIG. 7 shows a duplexer filter having a transmitting side that leads to an antenna for output from a device to which the filter is connected and a receiving side with leads to the antenna for input to the same device. In FIG. 7, the antenna has one electrode coupled to two resonators of the filter. FIGS. 8–12 show other antenna coupling methods. FIG. 8 shows the antenna having one electrode coupled to one resonator. FIG. 9 shows two electrodes emanating from one antenna, where each electrode is coupled to a resonator. FIG. 10 shows antenna having an electrode connected between two resonators and this electrode being coupled in a new way to two other electrodes, whereby these electrodes are each coupled to a resonator. FIG. 11 shows a close up view of FIG. 10. FIG. 12 shows an antenna have a large electrode that is coupled to two resonators.

Figure 13:
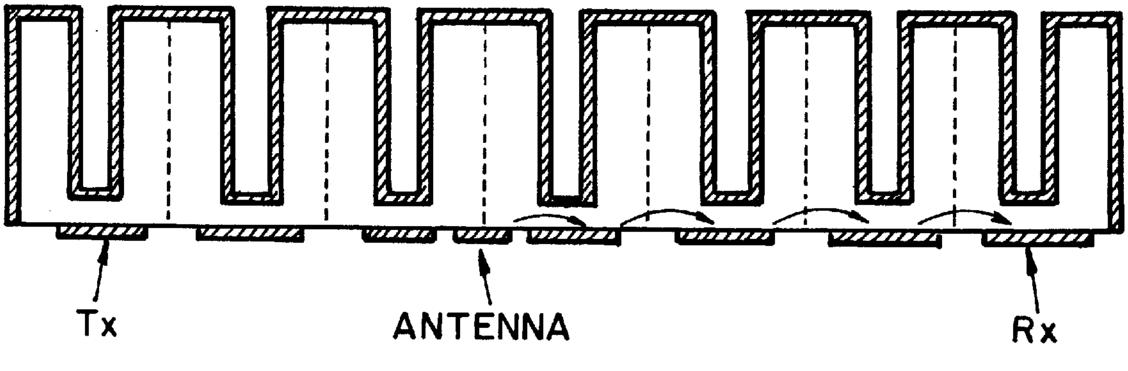
FIG. 13 is a schematic cross-sectional view of a duplexer filter employing electrode coupling between the resonators of the filter according to present invention.
Figure 14:
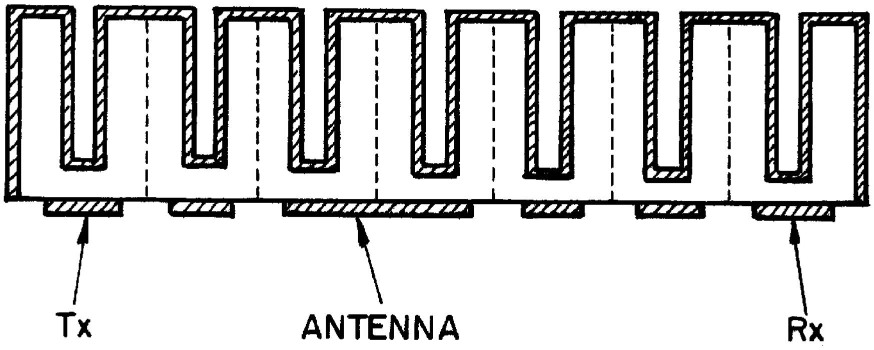
FIG. 14 is a schematic cross-sectional view of a duplexer filter employing electrode coupling between the resonators of the filter according to present invention.
Figure 15:
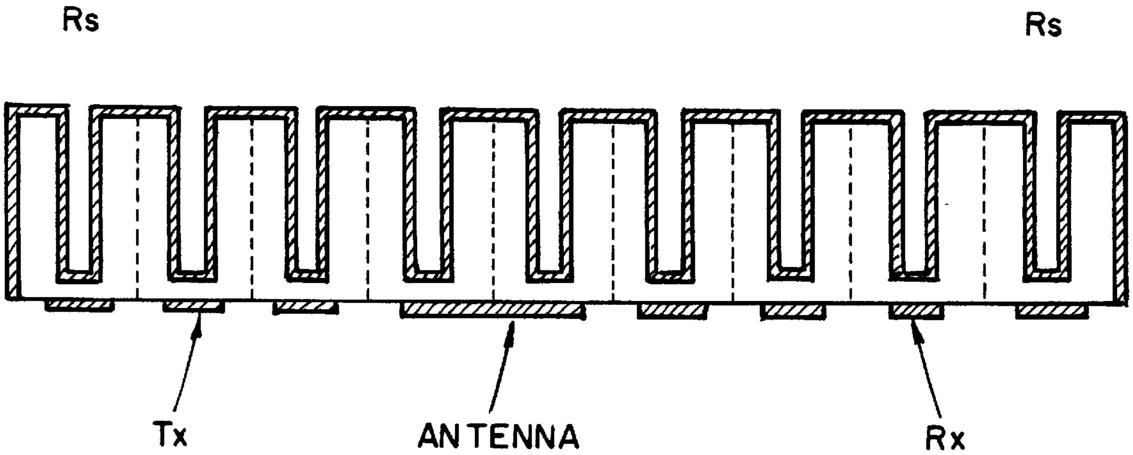
FIG. 15 is a schematic cross-sectional view of another duplexer filter employing electrode coupling between the resonators of the filter according to present invention.
Figure 16:
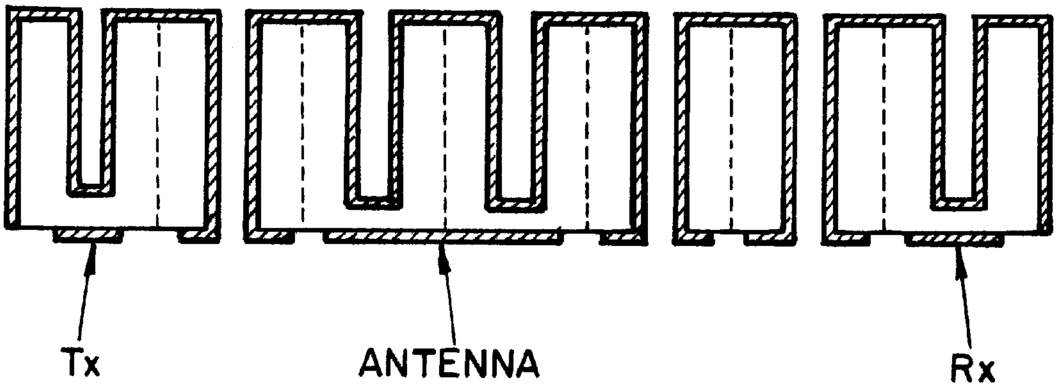
FIG. 16 is a schematic cross-sectional view of another duplexer filter employing electrode coupling between the resonators of the filter according to present invention.
Figure 17:
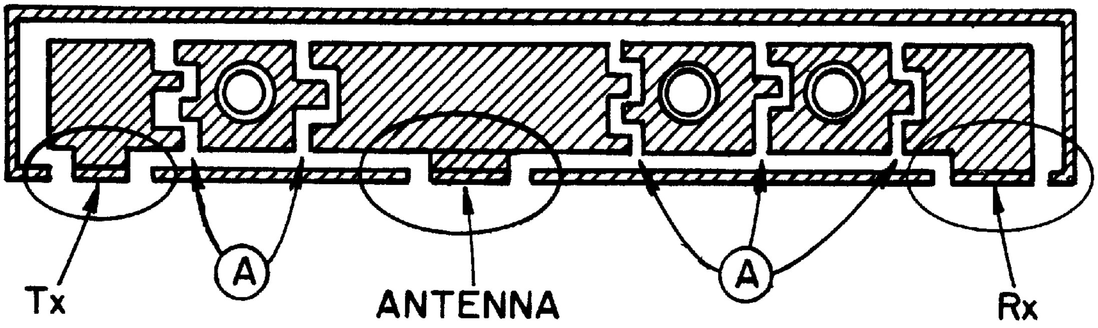
FIG. 17 is a schematic bottom view of FIG. 16.
Figure 18:
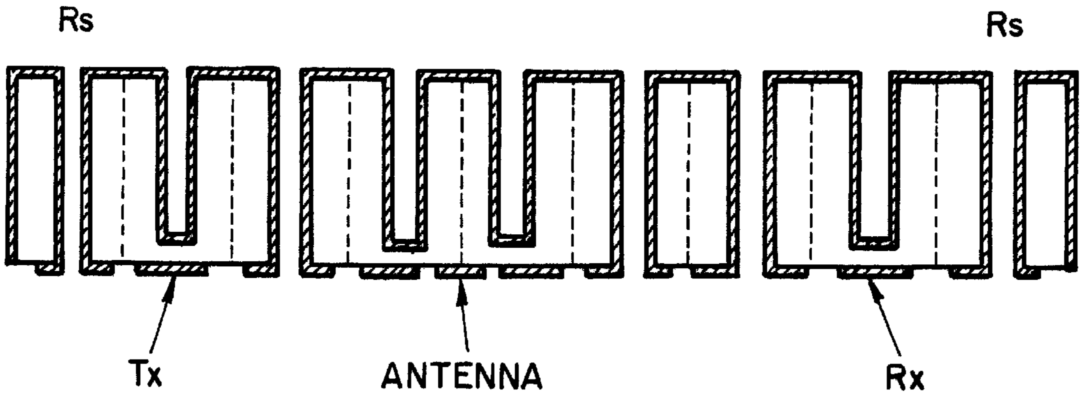
FIG. 18 is a schematic cross-sectional view of another duplexer filter employing electrode coupling between the resonators of the filter according to present invention.
Figure 19:
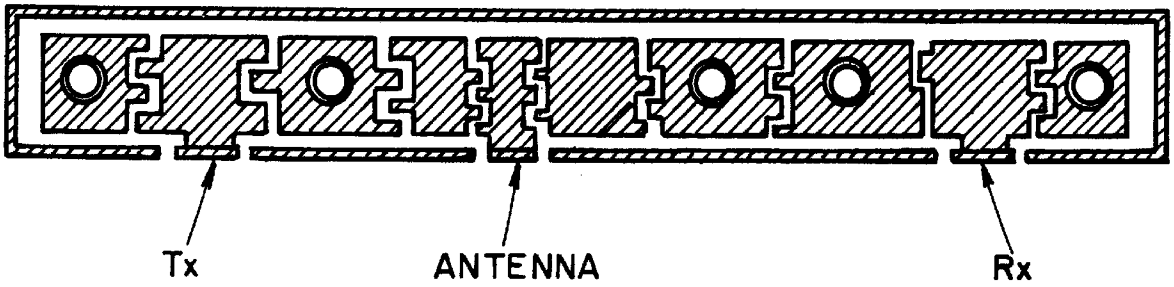
FIG. 19 is a schematic bottom view of FIG. 18.
Figure 20:
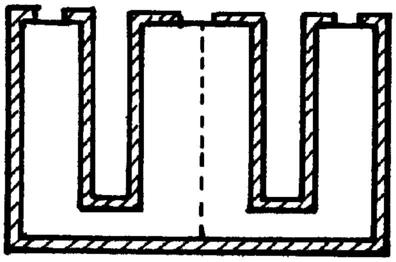
FIG. 20 is a schematic cross-sectional view of re-entrant resonators employing electrode coupling between the resonators at the top of the filter according to present invention.
Figure 21:
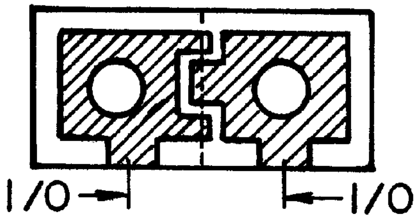
FIG. 21 is a schematic top view of FIG. 20.
Figure 22:
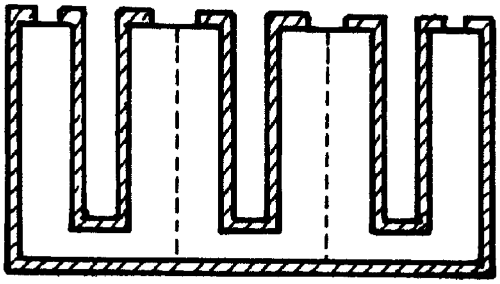
FIG. 22 is a schematic cross-sectional view of another filter of re-entrant resonators employing electrode coupling between the resonators at the top of the filter according to present invention.
Figure 23:
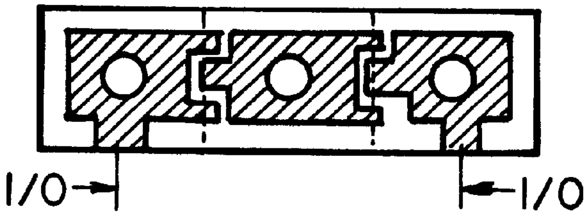
FIG. 23 is a schematic top view of FIG. 22.
Figure 24:
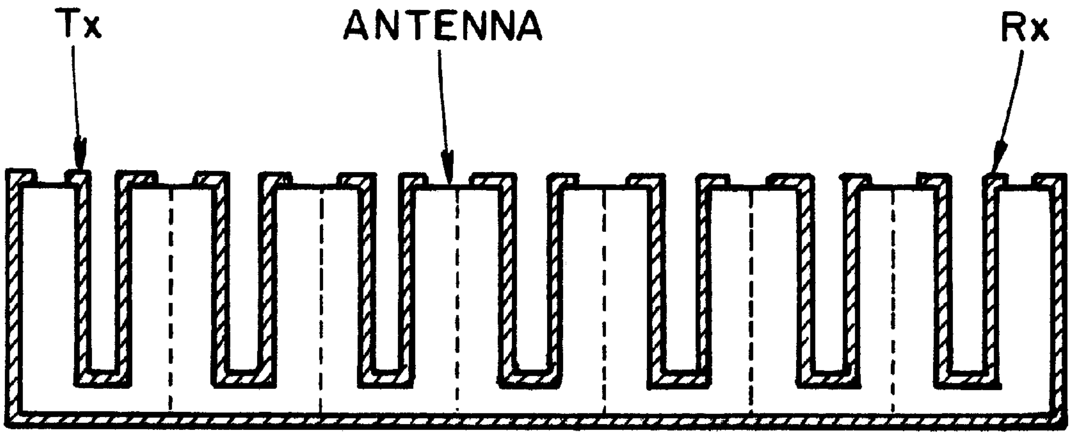
FIG. 24 is a schematic cross-sectional view of another filter of re-entrant resonators employing electrode coupling between the resonators at the top of the filter according to present invention.
Figure 25:
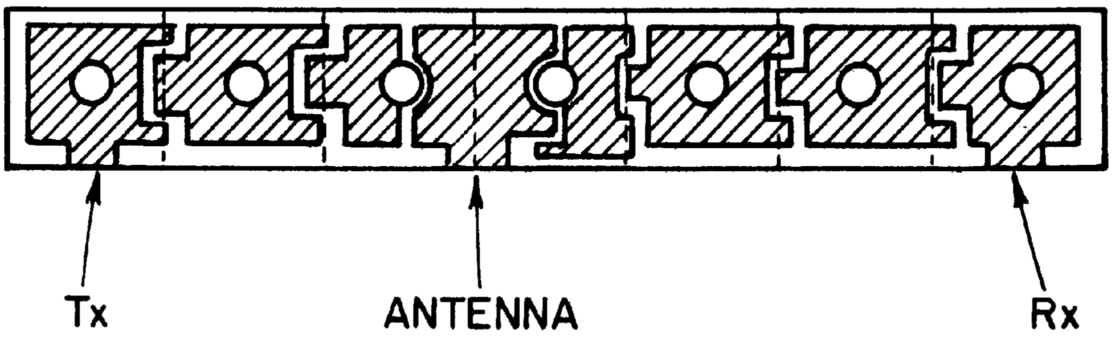
FIG. 25 is a schematic top view of FIG. 24.
Figure 26:
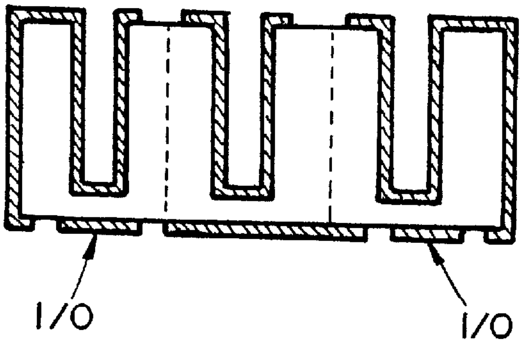
FIG. 26 is a schematic cross-sectional view of a filter of re-entrant resonators employing electrode coupling between the resonators at the top and bottom of the filter according to present invention.
Figure 27:
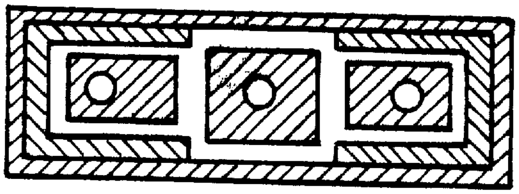
FIG. 27 is a schematic top view of FIG. 26.
Figure 28:
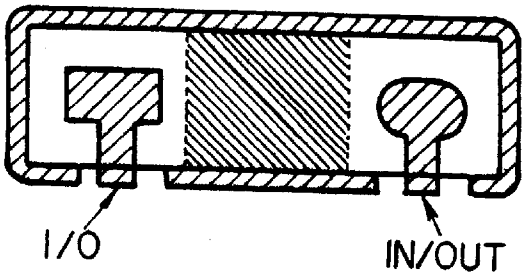
FIG. 28 is a schematic bottom view of FIG. 26.
Figure 29:
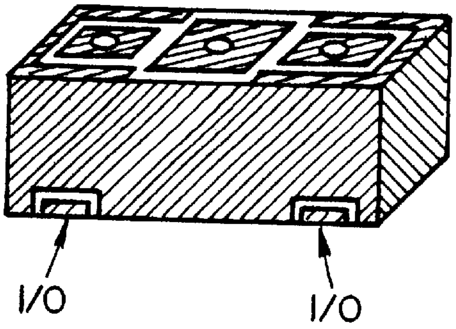
FIG. 29 is a three-dimensional top view of FIG. 26.
Figure 30:
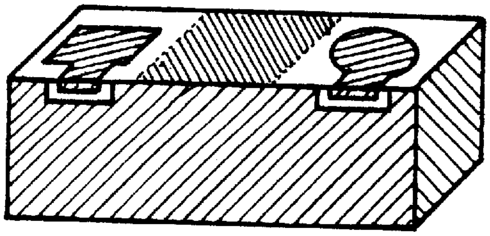
FIG. 30 is a three-dimensional bottom view of FIG. 26.
Figure 31:
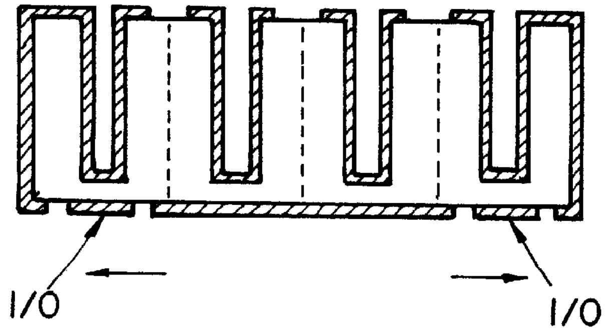
FIG. 31 is a schematic cross-sectional view of a filter of re-entrant resonators employing electrode coupling between the resonators at the top and bottom of the filter according to present invention.
Figure 32:
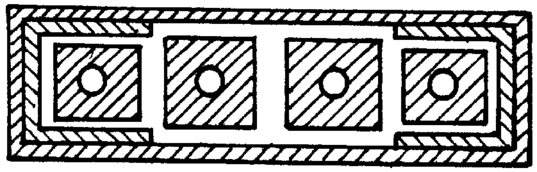
FIG. 32 is a schematic top view of FIG. 31.
Figure 33:
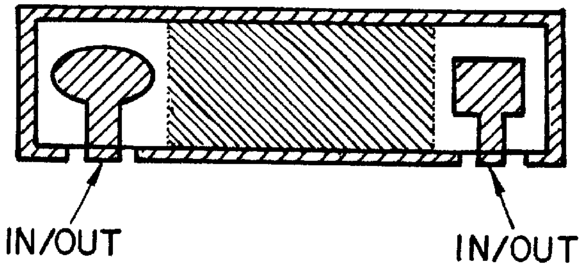
FIG. 33 is a schematic bottom view of FIG. 31.
Figure 34:
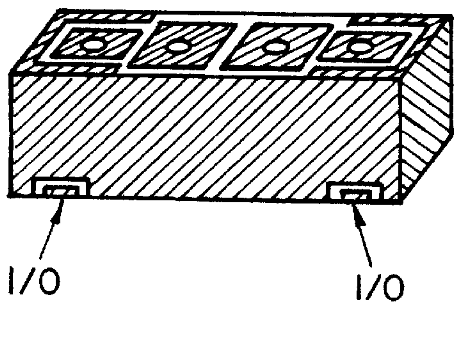
FIG. 34 is a three-dimensional top view of FIG. 31.
Figure 35:
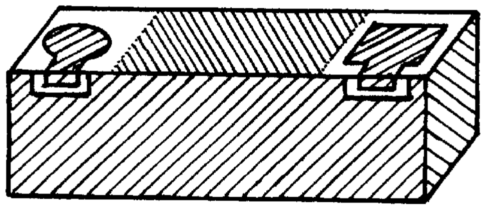
FIG. 35 is a three-dimensional bottom view of FIG. 31.
Figure 36:
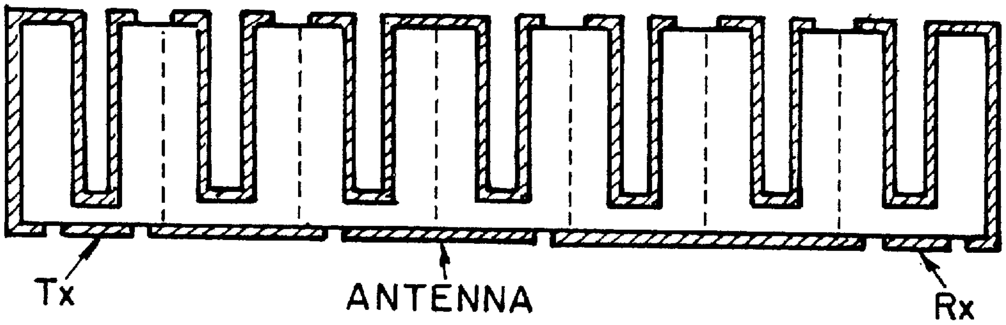
FIG. 36 is a schematic cross-sectional view of a filter of re-entrant resonators employing electrode coupling between the resonators at the top and bottom of the filter according to present invention.
Figure 37:
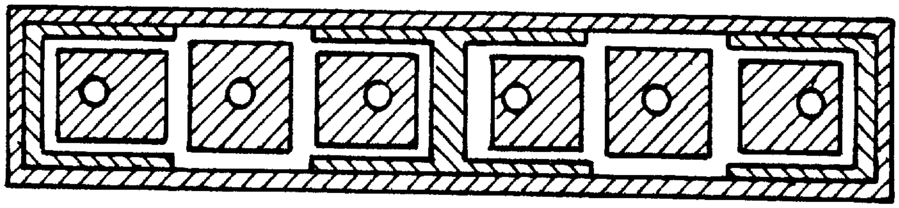
FIG. 37 is a schematic top view of FIG. 36.
Figure 38:
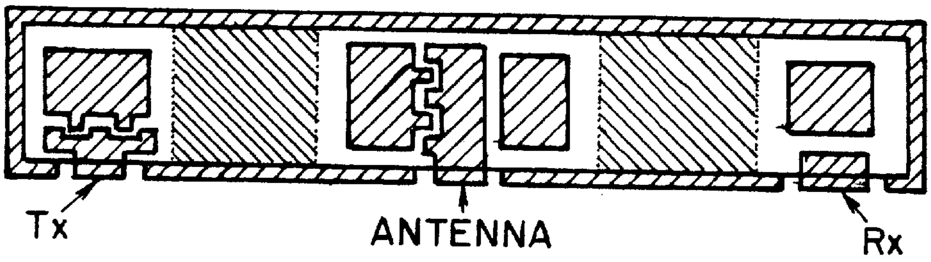
FIG. 38 is a schematic bottom view of FIG. 36.
Figure 39:
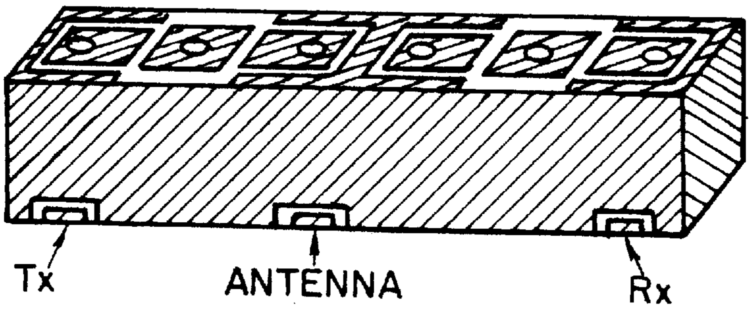
FIG. 39 is a three-dimensional top view of FIG. 36.
Figure 40:
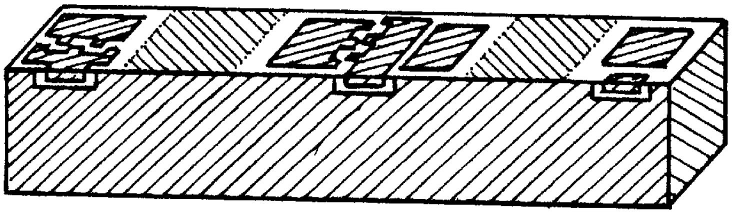
FIG. 40 is a three-dimensional bottom view of FIG. 36.
Figure 41:
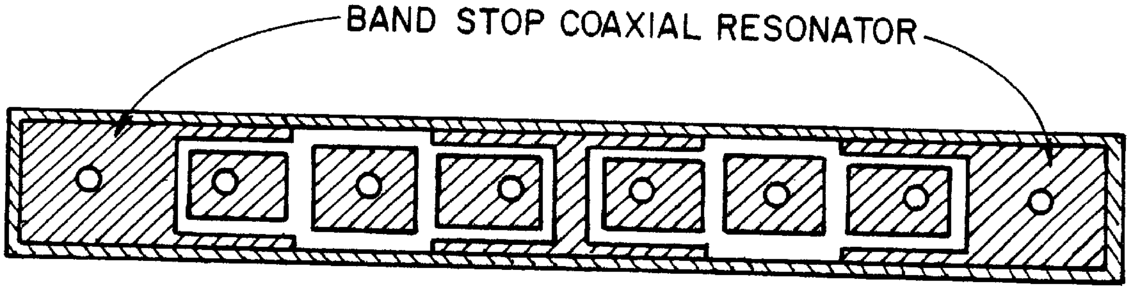
FIG. 41 is a schematic top view of a filter of re-entrant resonators with coaxial resonators at the ends to improve Skirt response and employs electrode coupling between the resonators at the top and bottom of the filter according to present invention.
Figure 42:
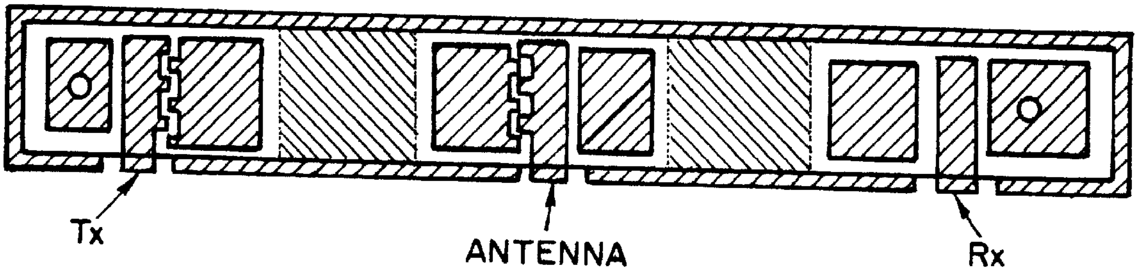
FIG. 42 is a schematic bottom view of FIG. 41.
Figure 43:
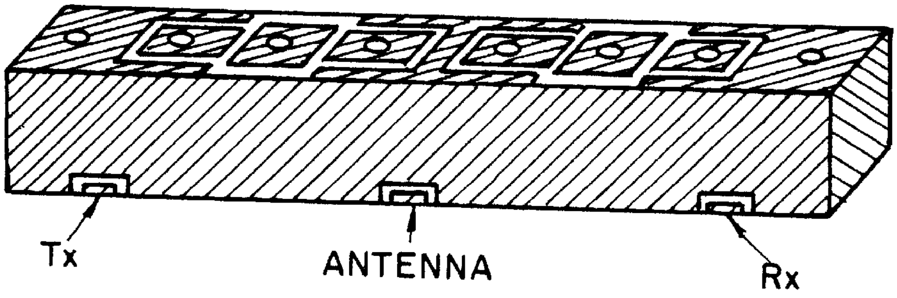
FIG. 43 is a three-dimensional top view of FIG. 41.
Figure 44:
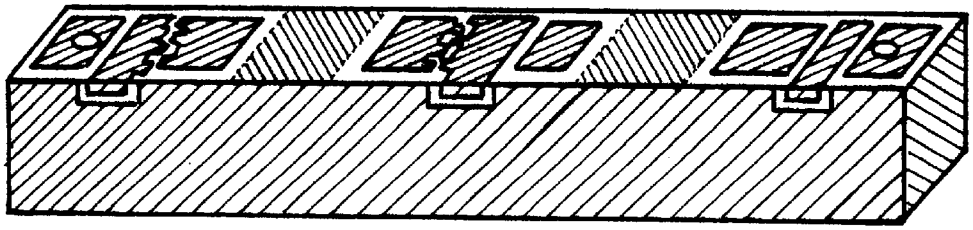
FIG. 44 is a three-dimensional bottom view of FIG. 41.
Figure 45:
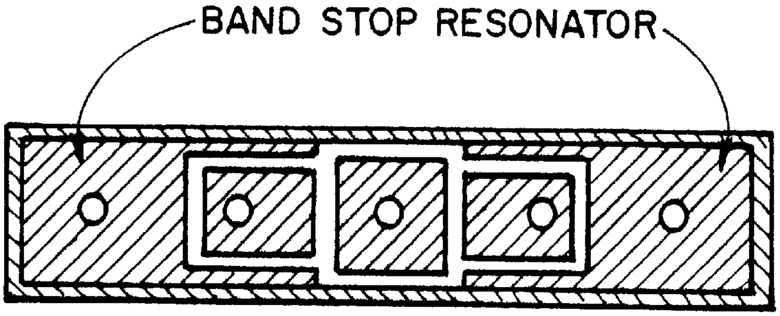
FIG. 45 is a schematic top view of the filter of FIG. 27 with coaxial resonators at the ends to improve Skirt response and employs electrode coupling between the resonators at the top and bottom of the filter according to present invention.
Figure 46:
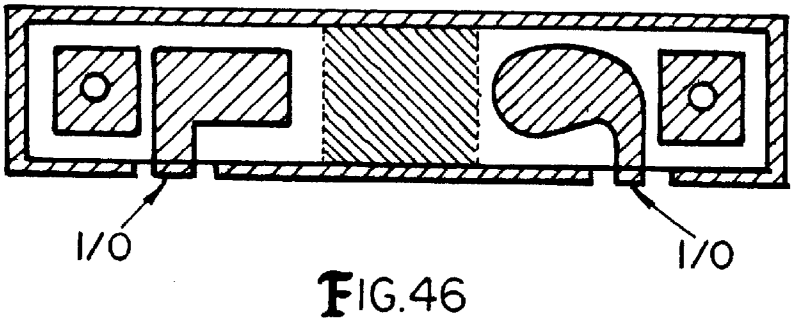
FIG. 46 is a schematic bottom view of FIG. 45.
Figure 47:
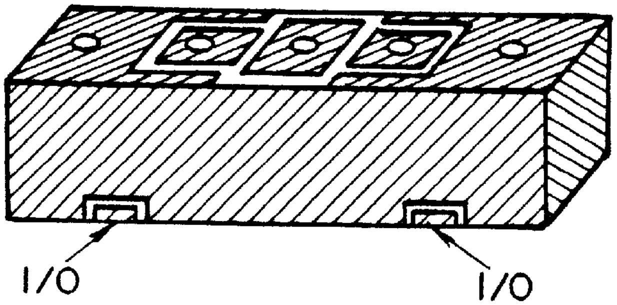
FIG. 47 is a three-dimensional top view of FIG. 45.
Figure 48:
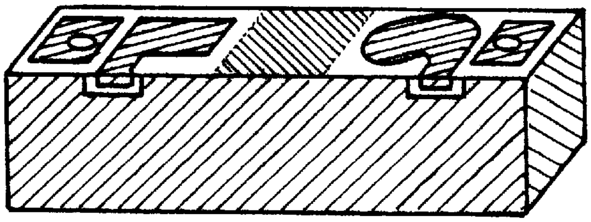
FIG. 48 is a three-dimensional bottom view of FIG. 45.
Figure 49:
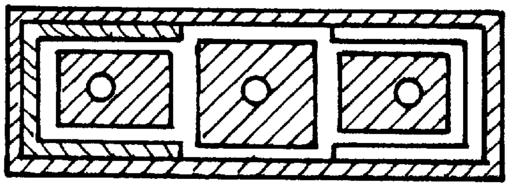
FIG. 49 is a schematic top view of a filter of coaxial and re-entrant resonators which employs electrode coupling between the resonators at the top and bottom of the filter according to present invention.
Figure 50:
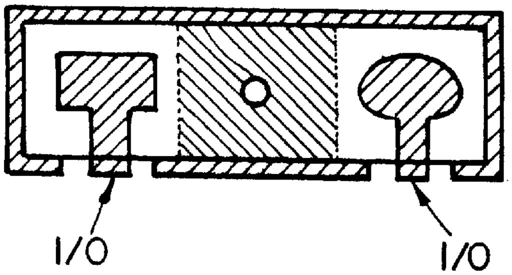
FIG. 50 is a schematic bottom view of FIG. 49.
Figure 51:
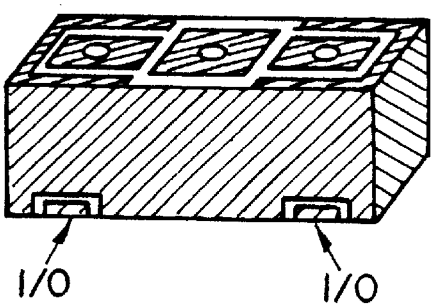
FIG. 51 is a three-dimensional top view of FIG. 49.
Figure 52:
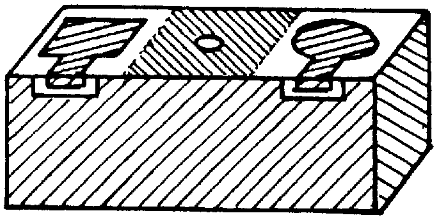
FIG. 52 is a three-dimensional bottom view of FIG. 49.
Figure 53:
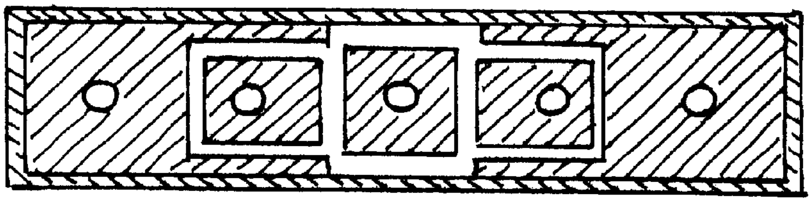
FIG. 53 is a schematic top view of a filter of coaxial and re-entrant resonators with coaxial resonators at the ends to improve Skirt response, where the filter employs electrode coupling between the resonators at the top and bottom of the filter according to present invention.
Figure 54:
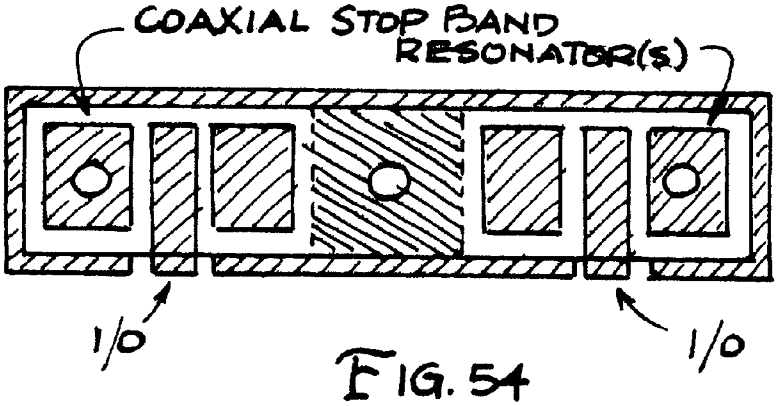
FIG. 54 is a schematic bottom view of FIG. 53.
Figure 55:
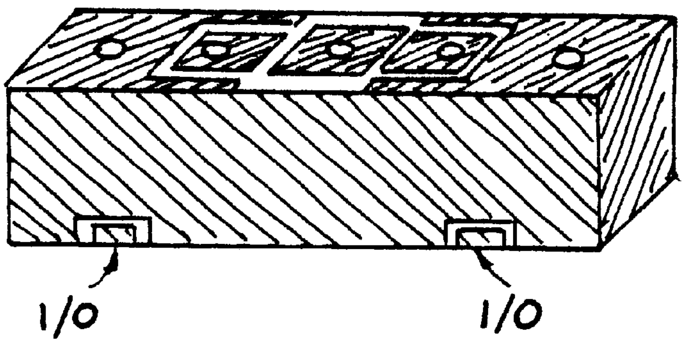
FIG. 55 is a three-dimensional top view of FIG. 53.
Figure 56:
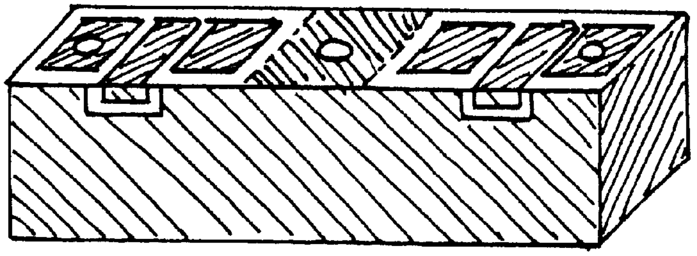
FIG. 56 is a three-dimensional bottom view of FIG. 53.
Figure 57:
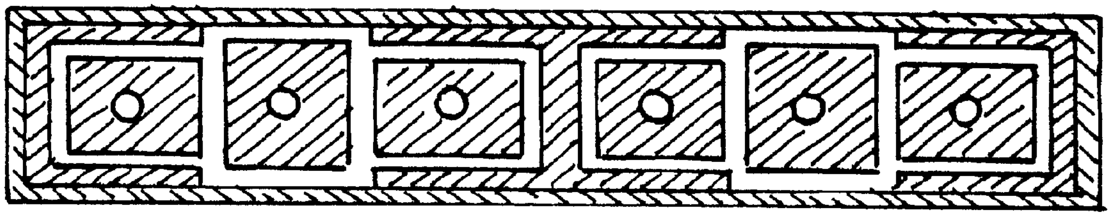
FIG. 57 is a schematic top view of a duplexer filter of coaxial and re-entrant resonators, where the filter employs electrode coupling between the resonators at the top and bottom of the filter according to present invention.
Figure 58:
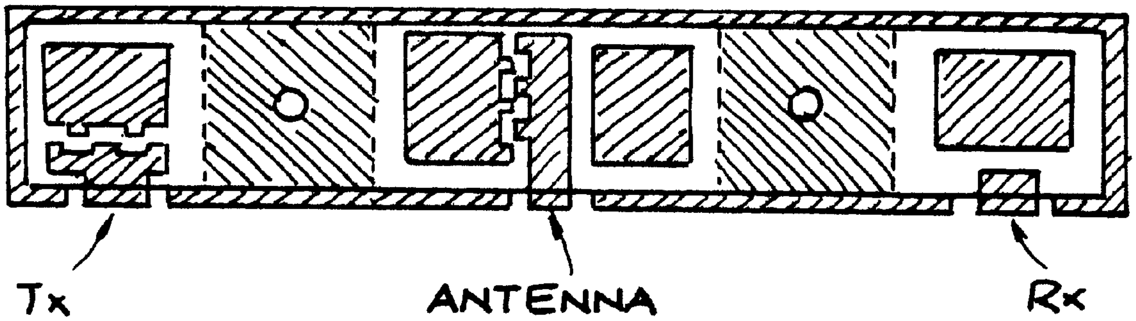
FIG. 58 is a schematic bottom view of FIG. 57.
Figure 59:
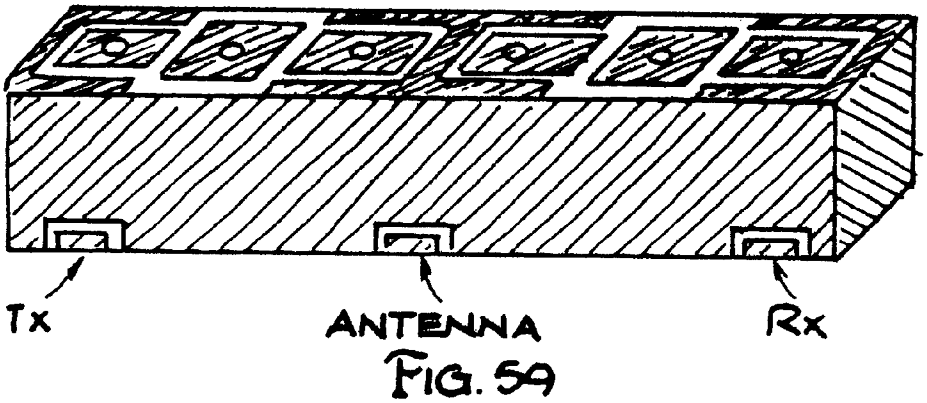
FIG. 59 is a three-dimensional top view of FIG. 57.
Figure 60:
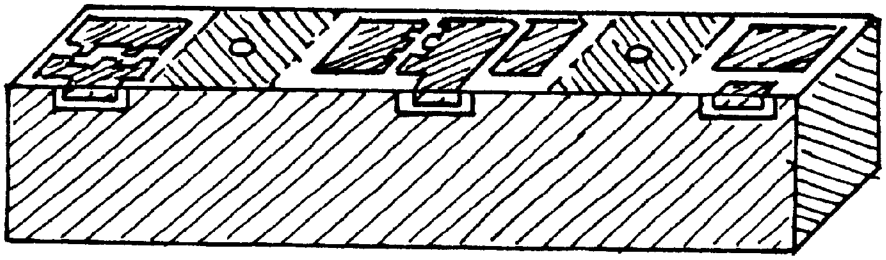
FIG. 60 is a three-dimensional bottom view of FIG. 57.
Figure 61:
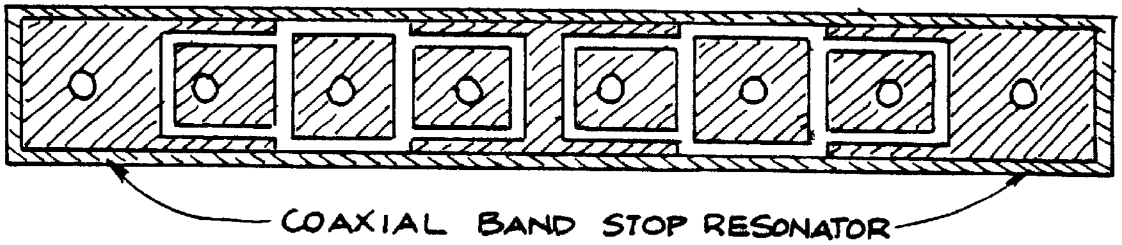
FIG. 61 is a schematic top view of a duplexer filter of coaxial and re-entrant resonators with coaxial resonators at the ends to improve Skirt response, where the filter employs electrode coupling between the resonators at the top and bottom of the filter according to present invention.
Figure 62:
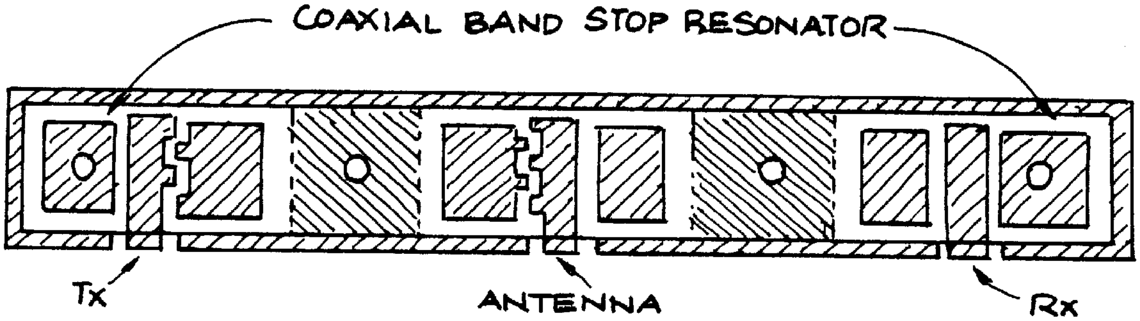
FIG. 62 is a schematic bottom view of FIG. 61.
Figure 63:
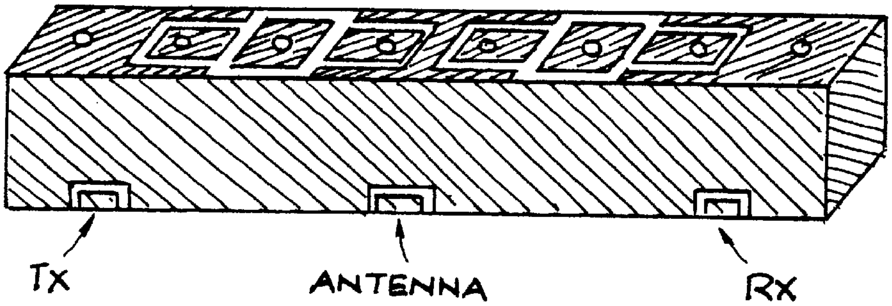
FIG. 63 is a three-dimensional top view of FIG. 61.
Figure 64:
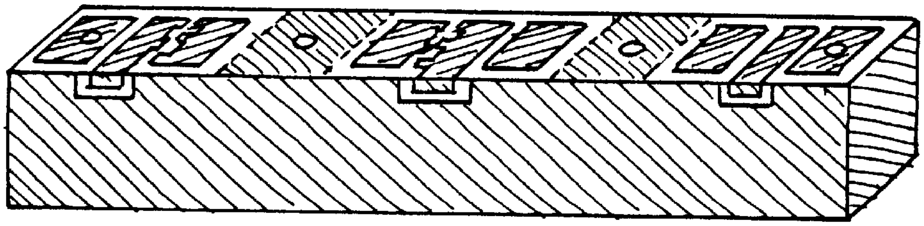
FIG. 64 is a three-dimensional bottom view of FIG. 61.

FIGS. 13–64 show a method of coupling resonators, similar to the antenna coupling of FIG. 10. In FIGS. 13–64, electrode coupling is used, whereby electric and magnetic fields jump from electrode to electrode through the dielectric material of the resonator instead of through IRIS passages. This allows the filter to be made from a monolithic single block of ceramic or other material. FIGS. 13–14 show a duplexer filter, but with different antenna coupling configurations. FIG. 15 shows a duplexer with band stop resonators for improving Skirt response. FIGS. 16–17 show cross-section and bottom views of applying the method of FIGS. 13–15 to form a filter from a monolithic single ceramic block, yet include both re-entrant resonators and coaxial resonators. Here the electrodes of the coaxial resonators are attached to dielectric material common to other electrodes, namely the electrodes of the re-entrant resonators. Whereby, the electric and magnetic fields jump from one electrode to another. FIGS. 18–19 show a version of FIGS. 16–17 with additional resonators to improve skirt response. FIGS. 20–25 show the use of re-entrant resonators with all of the electrodes mounted to a top surface of the monolithic single ceramic block. FIGS. 26–44 show a combination of both top and bottom electrodes on a monolithic single ceramic block of re-entrant resonators. FIGS. 45–48 show respectively top, bottom and three-dimensional views of the three-pole configuration of FIG. 27 flanked by two coaxial resonators to improve Skirt response of the filter. FIGS. 49–64 show a monolithic single ceramic block with a mixture of re-entrant resonators and coaxial resonators with top and bottom electrodes.

Figure 65:
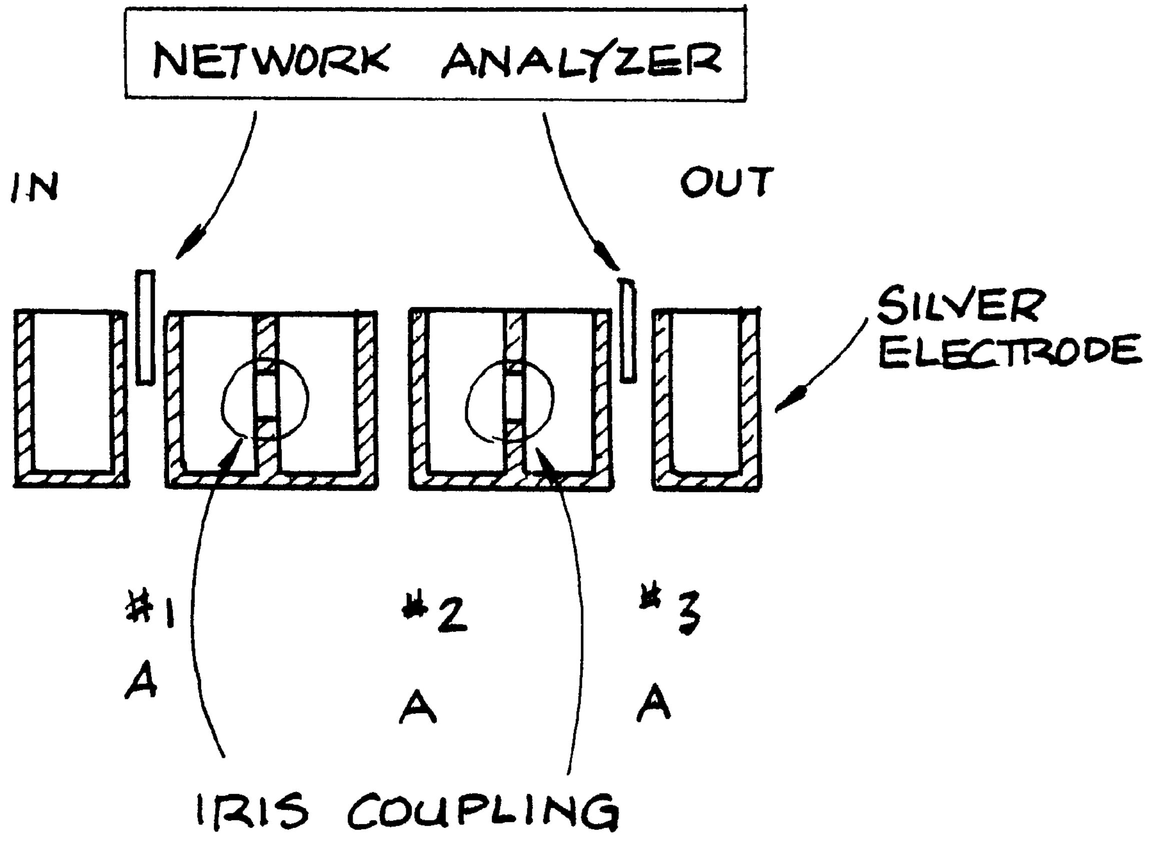
FIG. 65 is a schematic cross-sectional view of a three-pole filter used as a base line according to the present invention.
Figure 66:
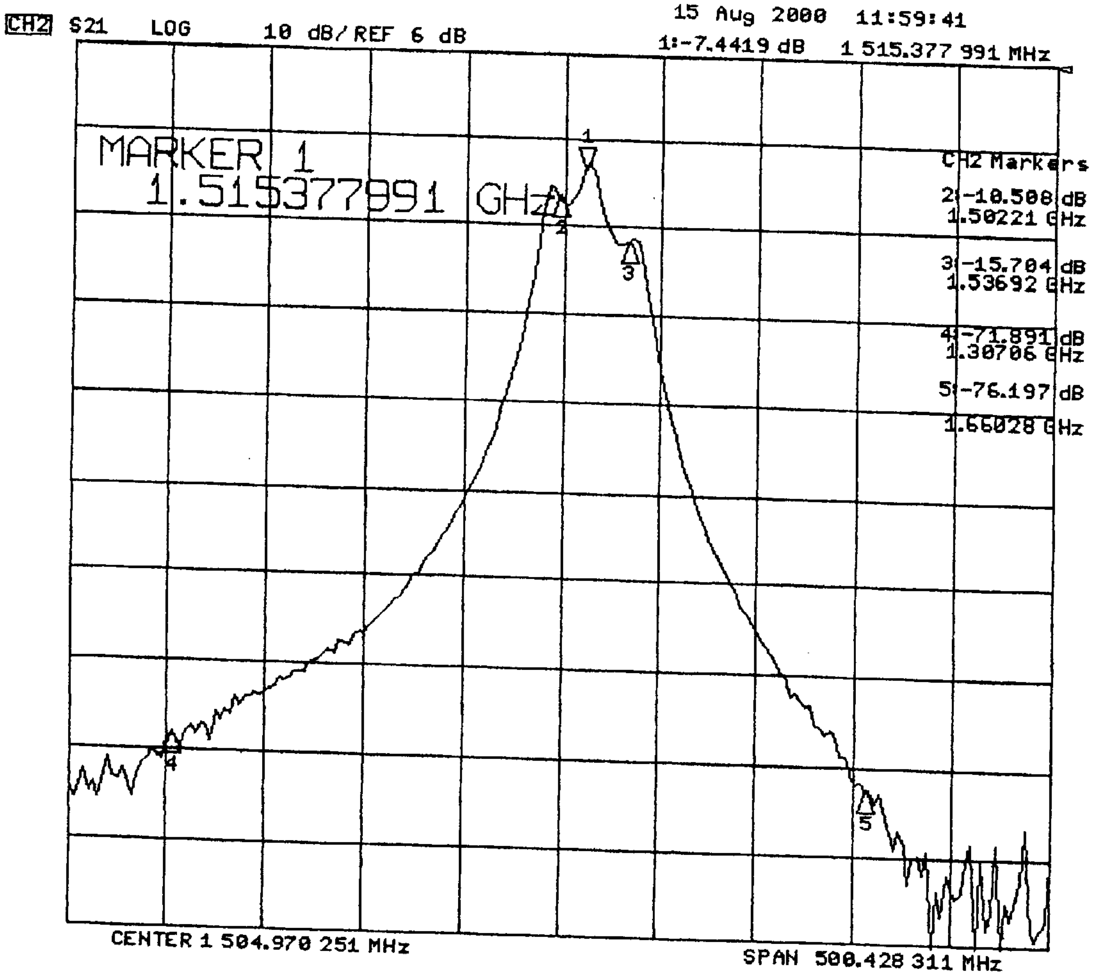
FIG. 66 is a plot of the filter response of the filter of FIG. 65 according to the present invention.
Figure 67:
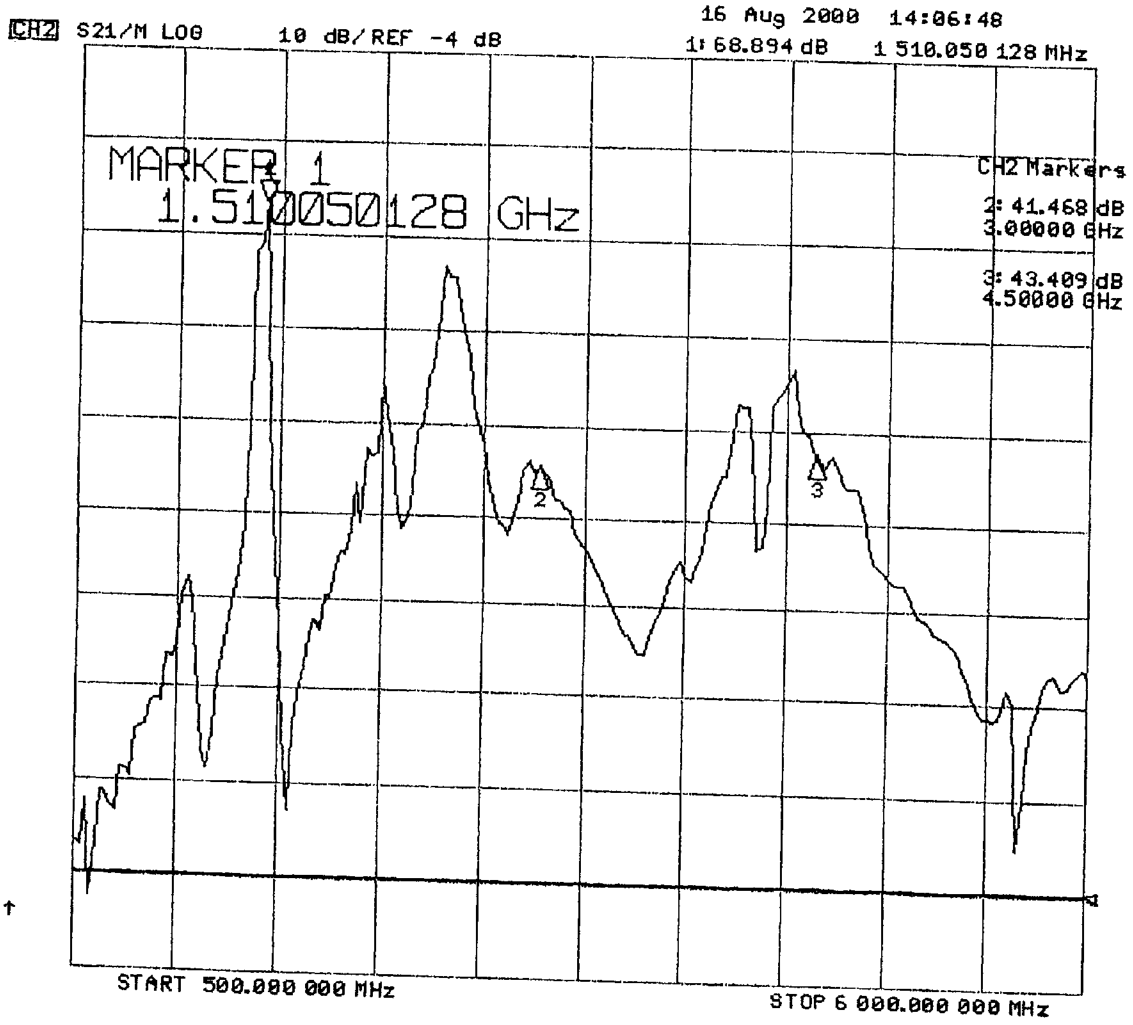
FIG. 67 is a plot of the spurious frequency response of the filter of FIG. 65 according to the present invention.
Figure 68:
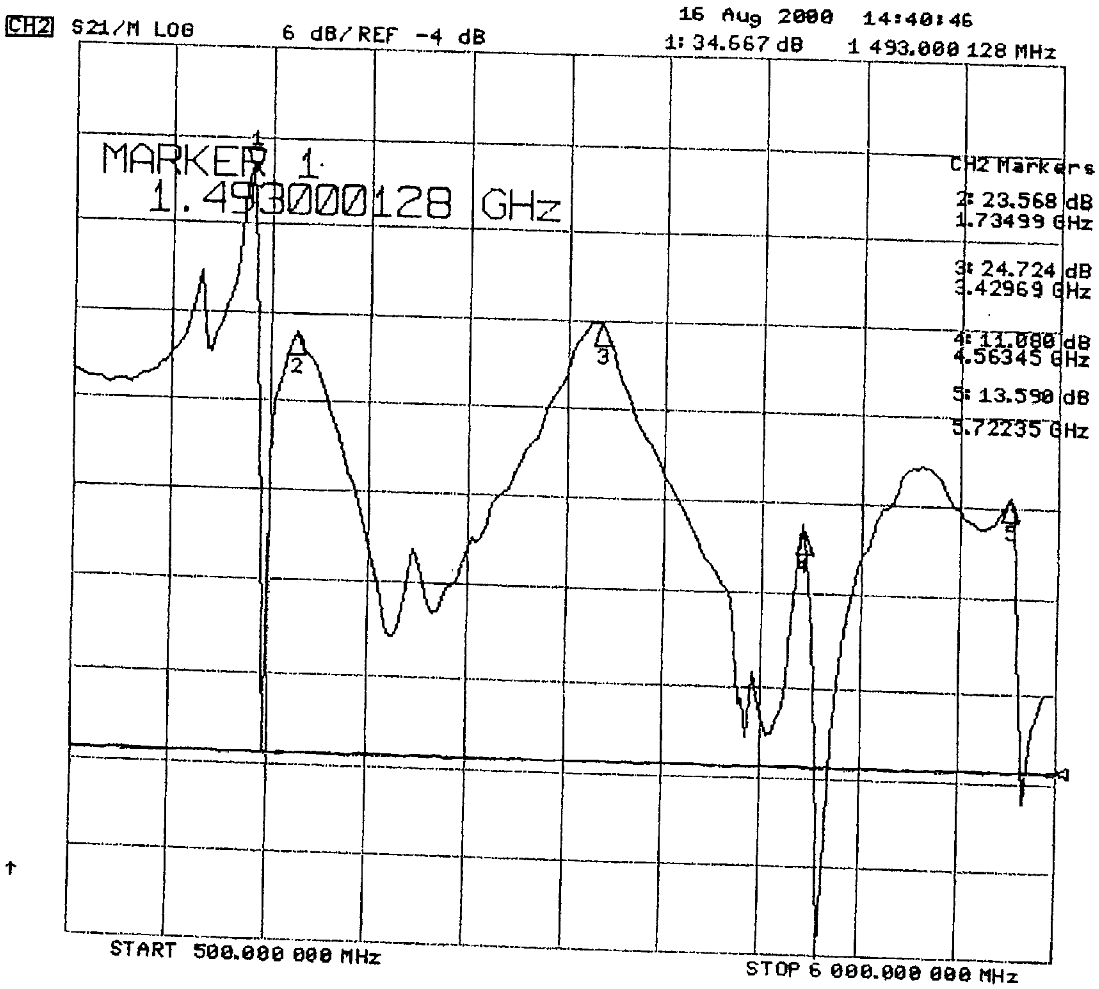
FIG. 68 is a plot of the frequency response of coaxial resonator #1 shown in FIG. 65 according to the present invention.
Figure 69:
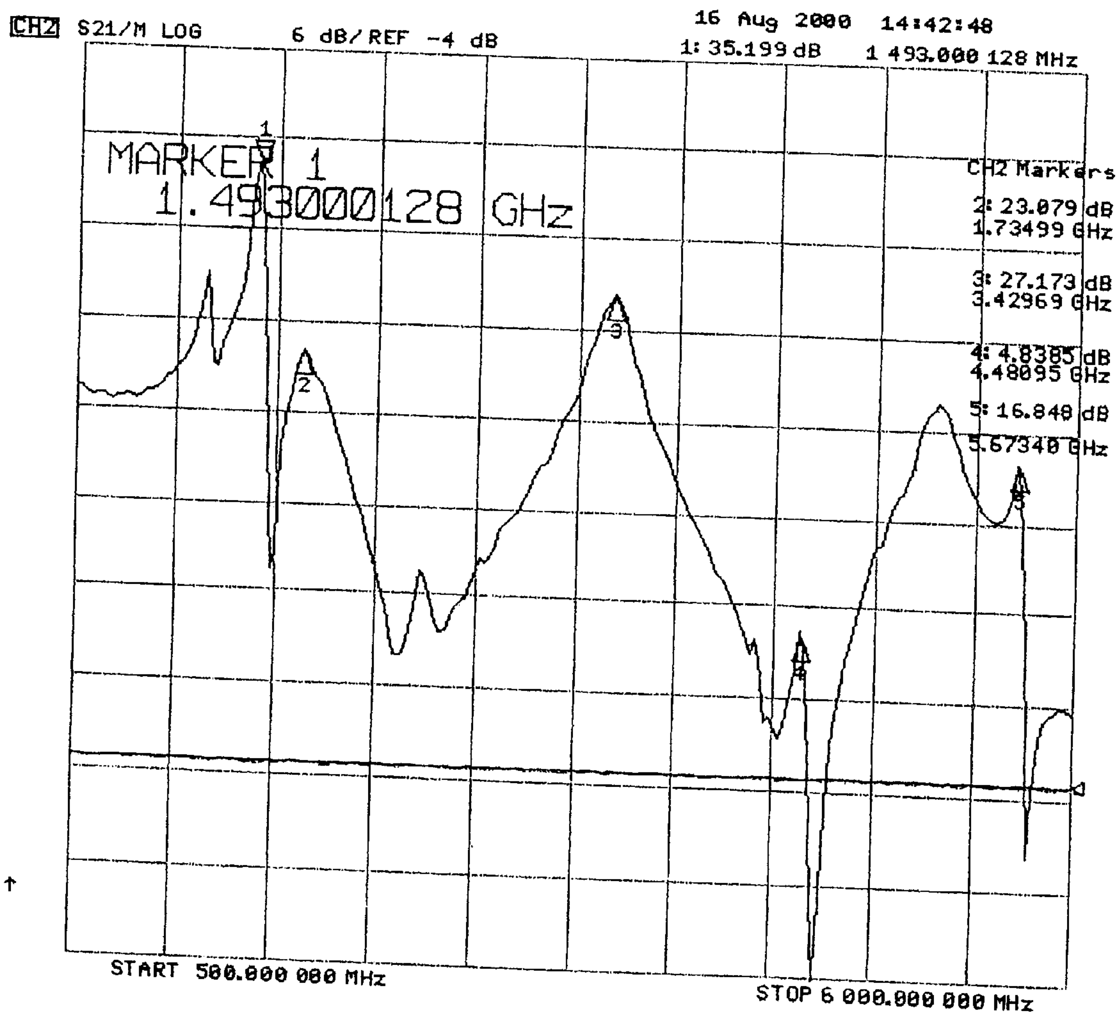
FIG. 69 is a plot of the frequency response of coaxial resonator #2 shown in FIG. 65 according to the present invention.
Figure 70:
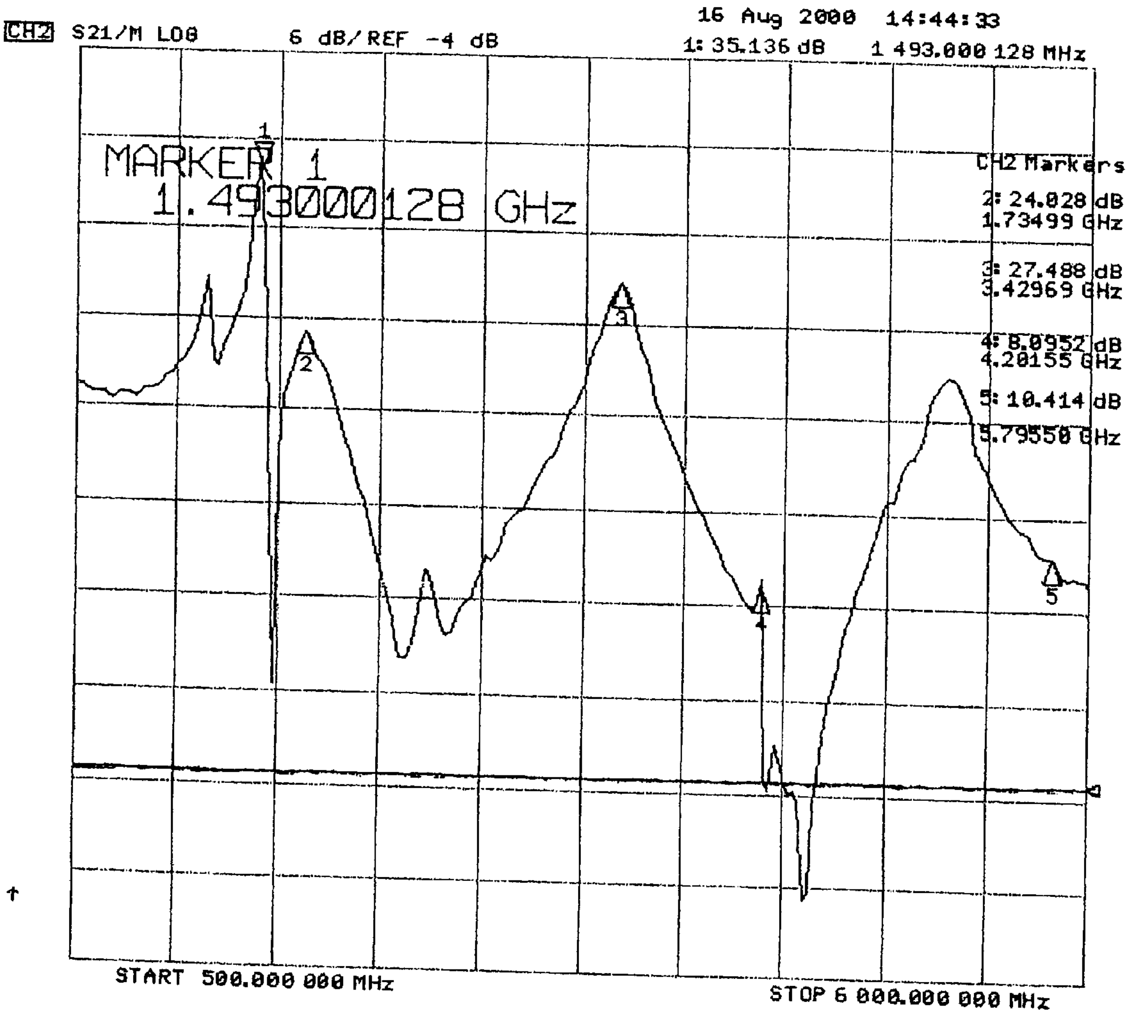
FIG. 70 is a plot of the frequency response of coaxial resonator #3 shown in FIG. 65 according to the present invention.
Figure 71:
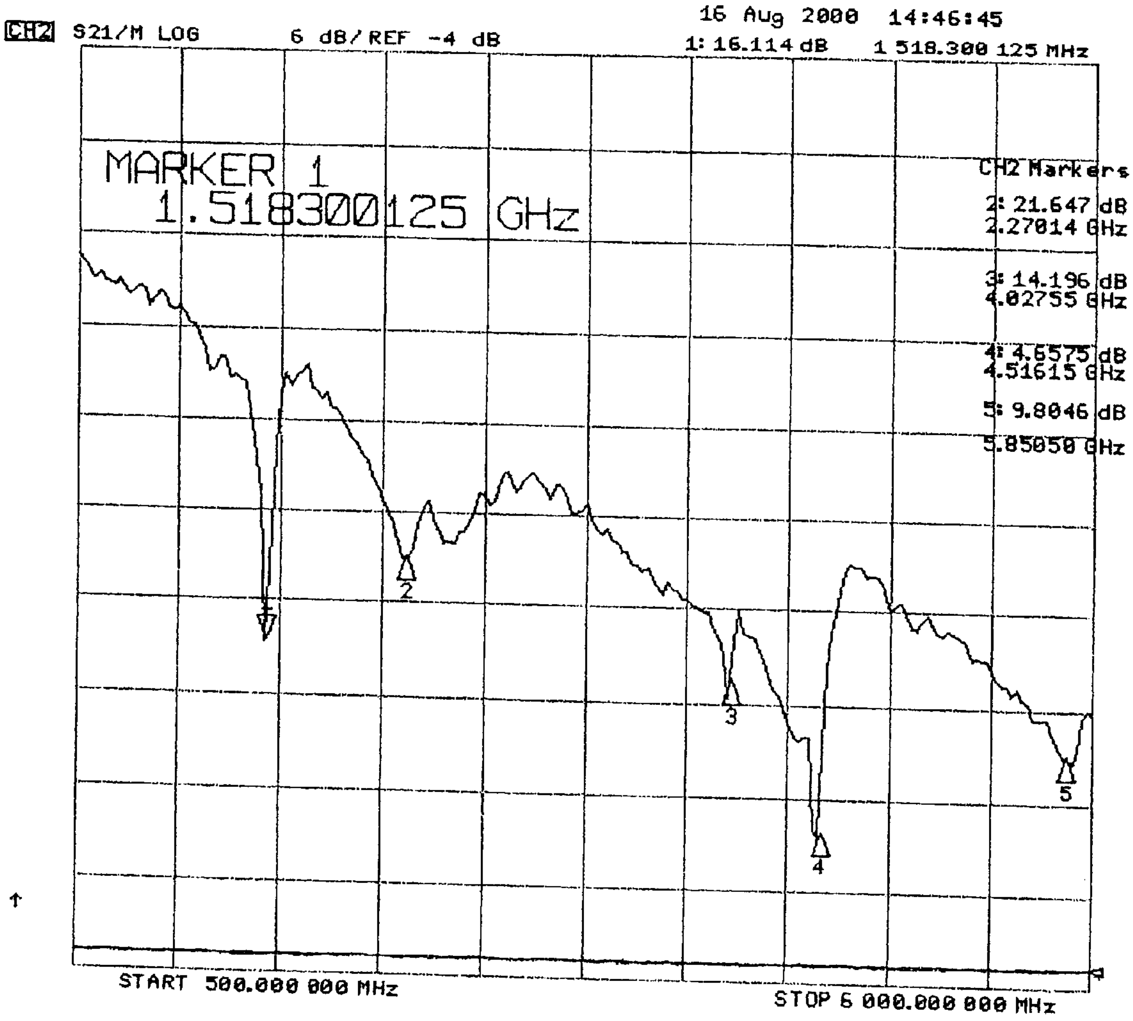
FIG. 71 is a plot of the frequency response of a re-entrant resonator according to the present invention.

The following describes methods to improve spurious frequency response of a filter by using different resonator types and by reversing resonator orientation. FIG. 65 shows a three-pole band pass filter, AAA to use as a base line response. The AAA filter was modeled after commercially available dielectric filters. Notice that all three "A" resonators, #1, #2, #3, are oriented same direction for the AAA filter. Three "A" resonators were selected and adjusted to make the band pass response of FIG. 66. The spurious frequency response of the AAA filter is shown in FIG. 67. Individual frequency response of each of the three resonators, #1, #2, #3, of the AAA filter is shown in FIGS. 68–70. Notice that there are the first and third harmonics of around 1.5 G Hz and 4.5 G Hz, respectively. The rest of the spurious frequency responses of above the first resonant peak are due to the higher order-mode in coaxial resonators, such as TE-mode, which is well known. The higher mode can exist only above the cutoff frequency of resonator. For testing purposes, the cutoff frequency was chosen to equal 1.9 G Hz, so that the most of the spurious frequency response above 1.9 G Hz can be explained as the higher-order-mode, which is unwanted for a band pass filter. FIG. 67 is base line data and other filter responses using different resonator types and reverse resonator orientation methods will be compared to FIG. 67. Also, a re-entrant resonator was used having a frequency response as shown in FIG. 71.

Figure 72:
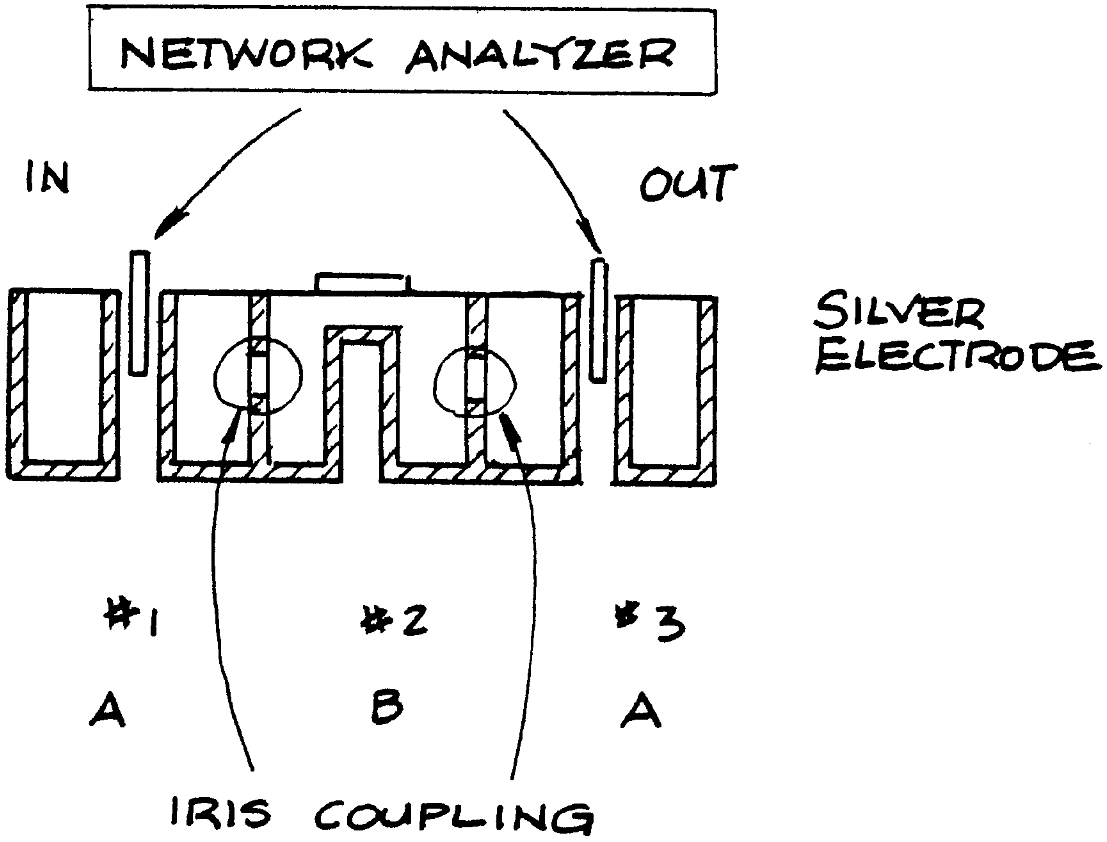
FIG. 72 is a schematic cross-sectional view of a three-pole filter similar to FIG. 65, where the #2 coaxial resonator is replaced by the re-entrant resonator of FIG. 71 according to the present invention.
Figure 73:
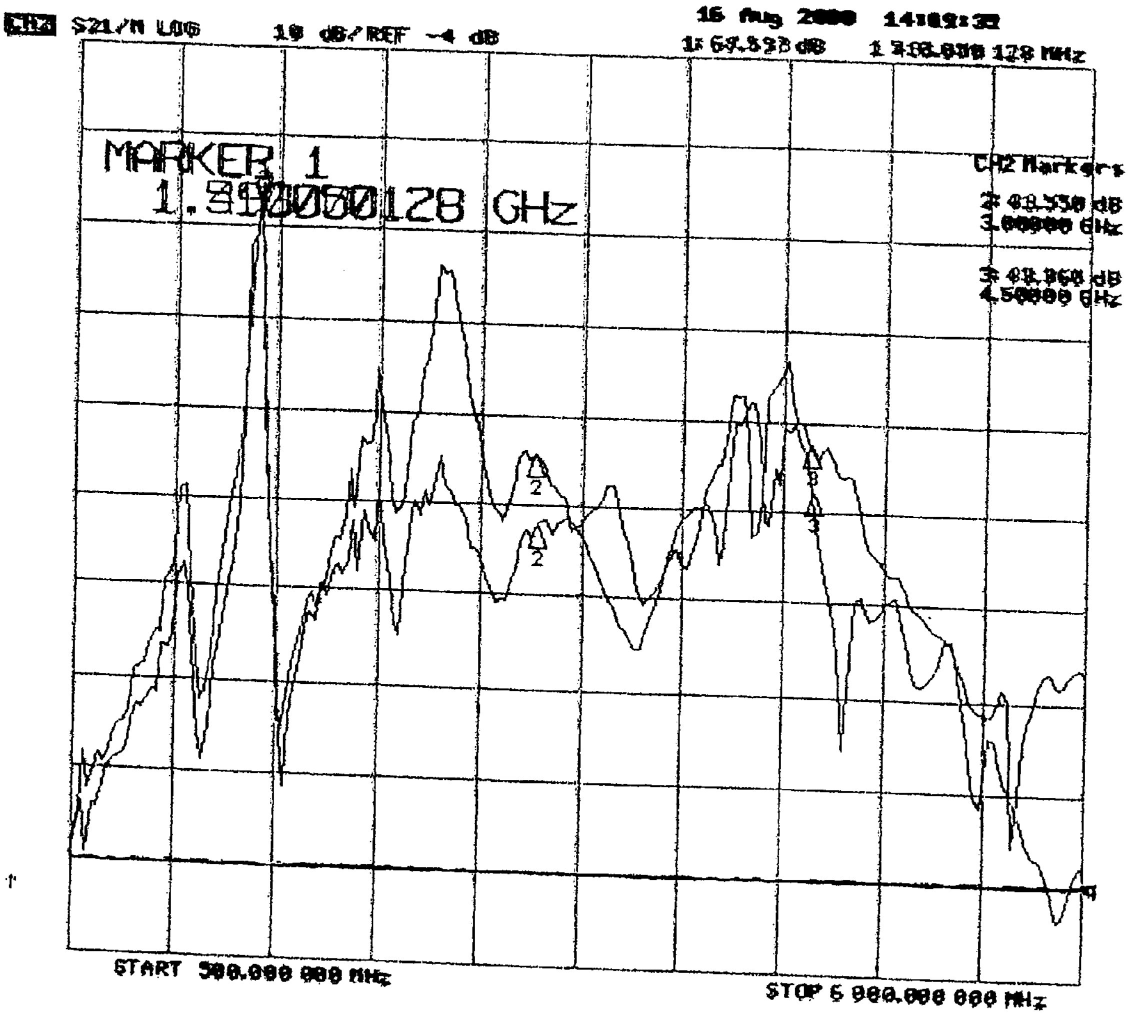
FIG. 73 is a plot of the frequency response of the filter shown in FIG. 72 according to the present invention.

In the data, the resonant peaks appear opposite in direction because of the single resonator coupling to a Network Analyzer, which is a convenient way to make a sample holder. A band pass filter ABA was made as shown in FIG. 72 by replacing the center #2 resonator of FIG. 66 with the re-entrant resonator having the frequency response shown in FIG. 71. The frequency response of the ABA filter is shown in FIG. 73 overlapping the base line data of FIG. 67. By replacing the center coaxial resonator with a re-entrant resonator, the spurious frequency response was improved the over wide range of higher frequency without adversely affecting the main filter characteristics near the first resonant peak.

Figure 74:
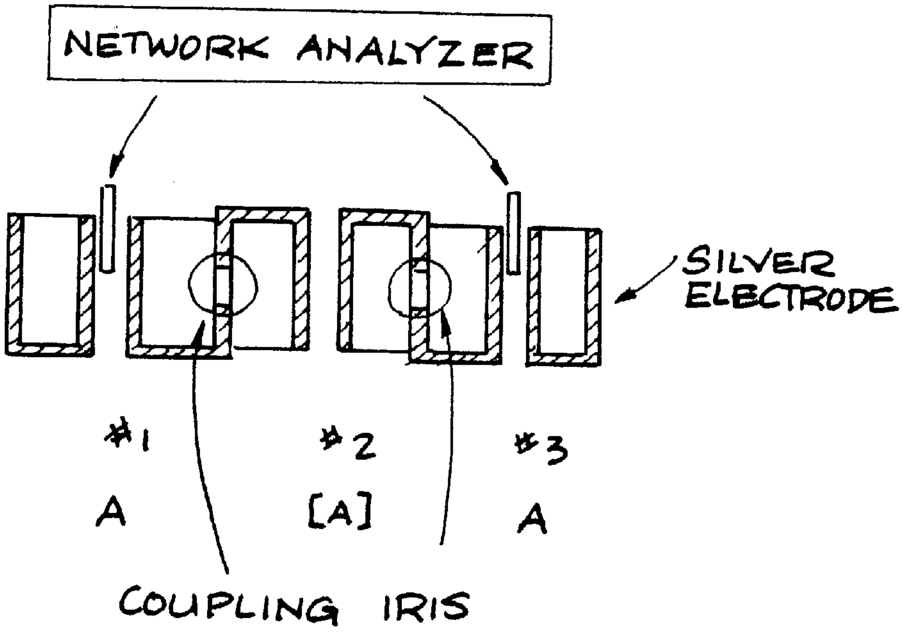
FIG. 74 is a schematic cross-sectional view of a three-pole filter similar to FIG. 65, where the #2 coaxial resonator is reversed in orientation according to the present invention.
Figure 75:
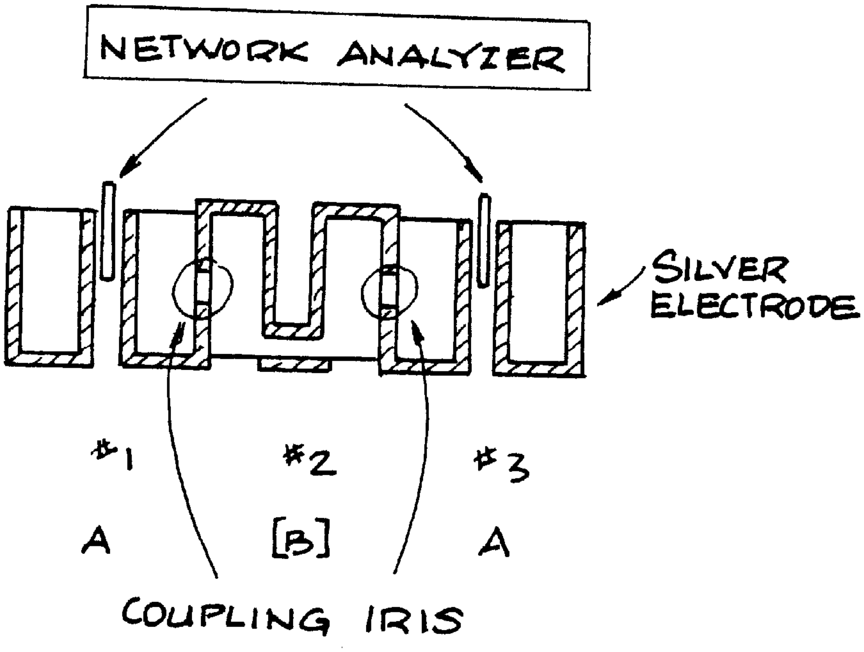
FIG. 75 is a schematic cross-sectional view of a three-pole filter similar to FIG. 72, where the #2 re-entrant resonator is reversed in orientation according to the present invention.
Figure 76:
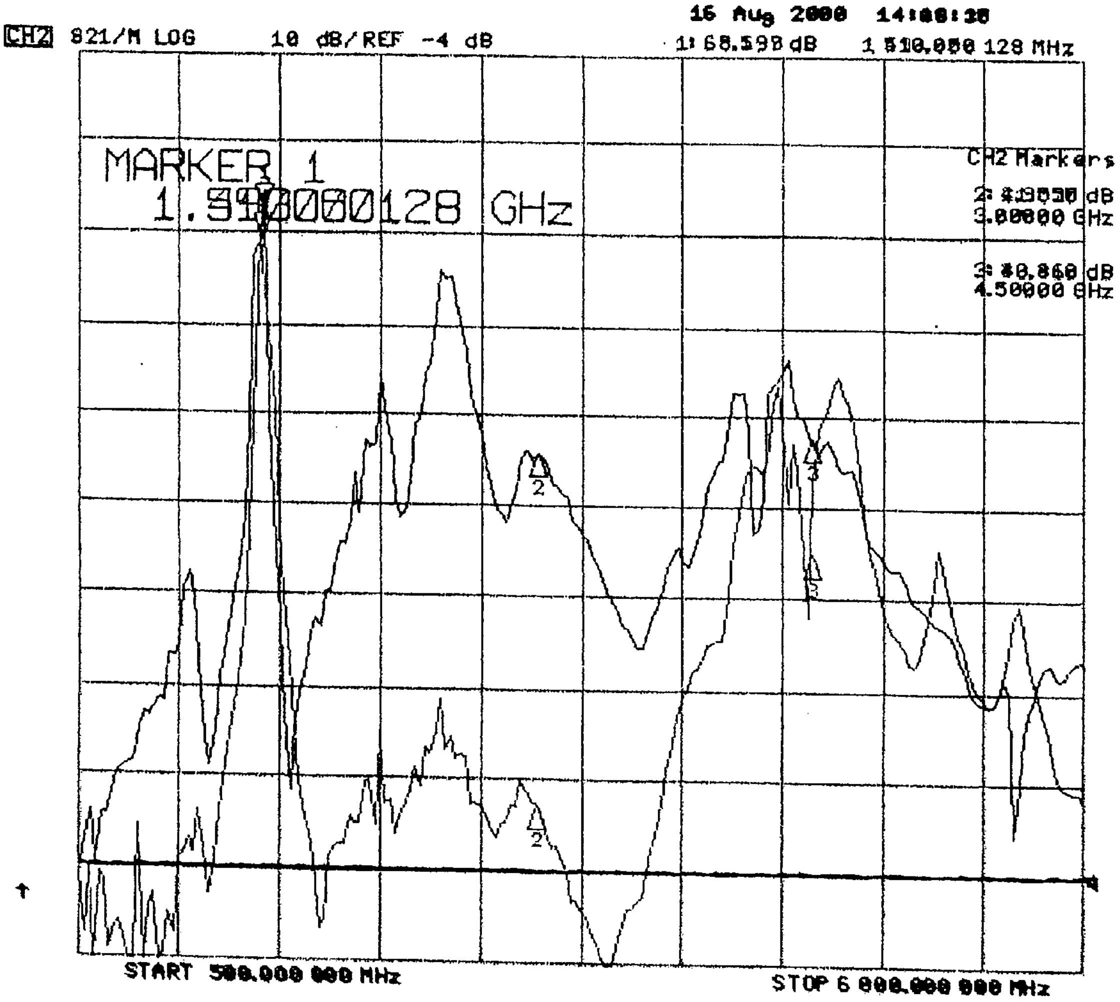
FIG. 76 is a plot of the frequency response of the filter shown in FIG. 74 according to the present invention.
Figure 77:
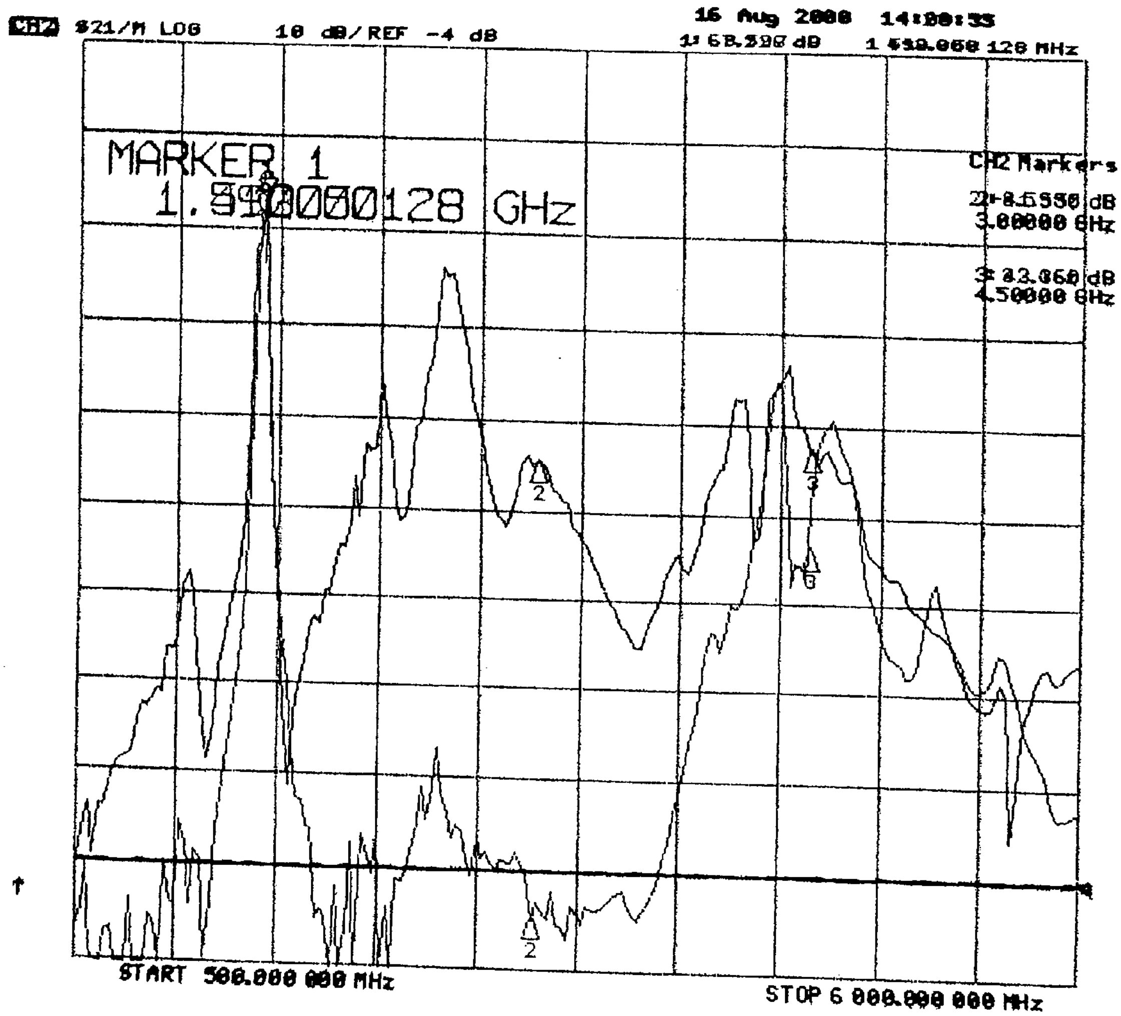
FIG. 77 is a plot of the frequency response of the filter shown in FIG. 75 according to the present invention.

In addition to the above method of mixing resonators to reduce.the spurious frequency responses of dielectric filters, a new coupling technique of reversing resonator orientation also improves filter characteristics. Orientation of a resonator is defined by the top of the resonator which has no electrode coating. FIGS. 74–75 show the new coupling method, which is the flipping over of the center resonator in the AAA and ABA filters, as shown in FIGS. 65 and 72, respectively. As can be seen from FIGS. 65 and 72, the resonators are orientated with all of the tops without electrode pointing upward. FIG. 74 shows filter A[A]A and FIG. 75 shows filter A[B]A, whereby the middle resonator of each filter is orientated with the top pointing downward. The same IRIS coupling is used in all of the AAA, ABA, A[A]A and A[B]A filters. The filter characteristics of the A[A]A filter are shown in FIG. 76 overlapping those of the AAA filter response. The filter characteristics of the A[B]A filter are shown in FIG. 77 overlapping those of the AAA filter response. As can been seen from FIGS. 76–77, there is an improvement in frequency responses that were achieved without effecting the main filter characteristics of around 1.5 G Hz for the first resonant peak. It is believed that these improvements stem from center resonator having a magnetic field that is opposite as compared to the magnetic fields of the outside resonators of the filter. The filters of FIGS. 74–75 can be made from a monoblock of material. The method reversing the orientation of a resonator in a filter can be applied to any number of POLE filters made, such as four-pole, five-pole and up to the nth-pole.

Figure 78:
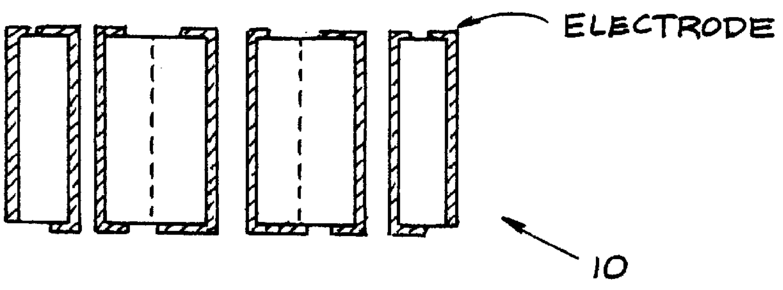
FIG. 78 is a schematic cross-sectional view of a filter employing electrode coupling to reverse resonator orientation in a filter according to present invention.
Figure 79:
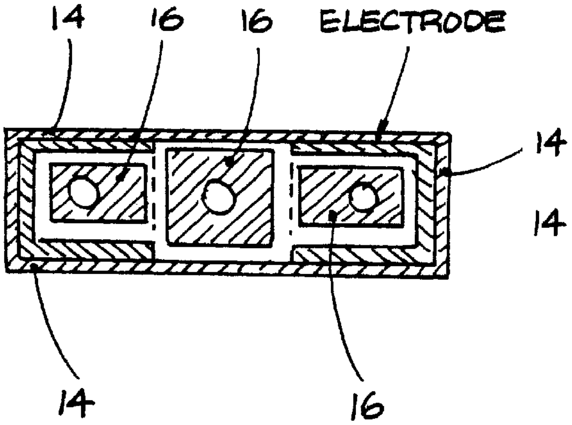
FIG. 79 is a top view of FIG. 78.
Figure 80:
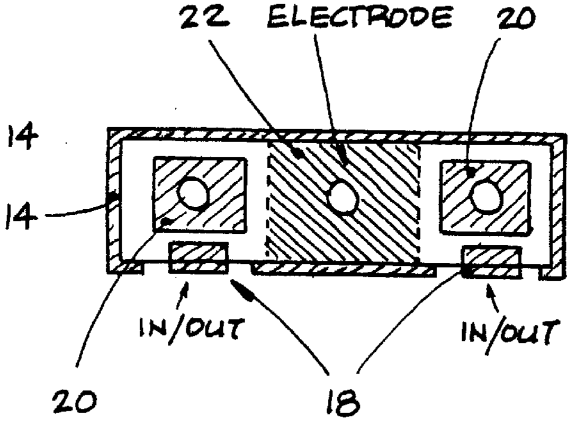
FIG. 80 is a bottom view of FIG. 78.
Figure 81:
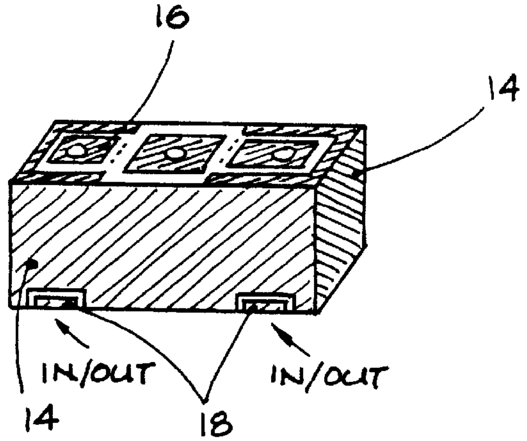
FIG. 81 is a three-dimensional top view of FIG. 78.
Figure 82:
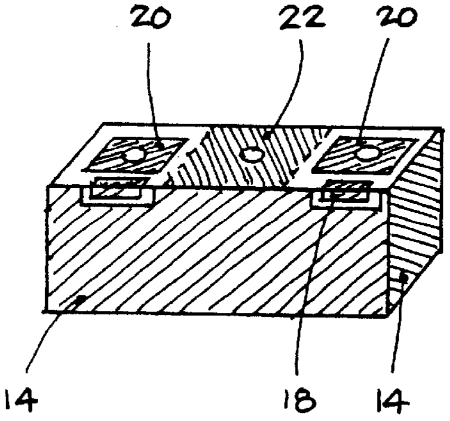
FIG. 82 is a three-dimensional bottom view of FIG. 78.
Figure 83:
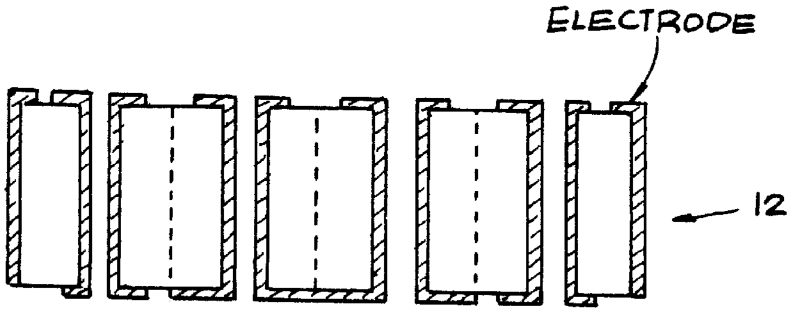
FIG. 83 is a schematic cross-sectional view of a filter employing electrode coupling to reverse resonator orientation in the filter according to present invention.
Figure 84:
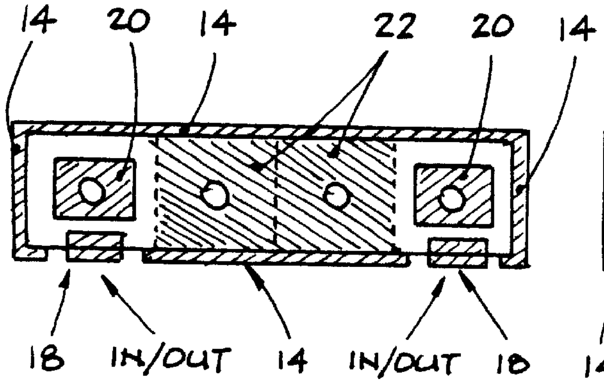
FIG. 84 is a bottom view of FIG. 83.
Figure 85:
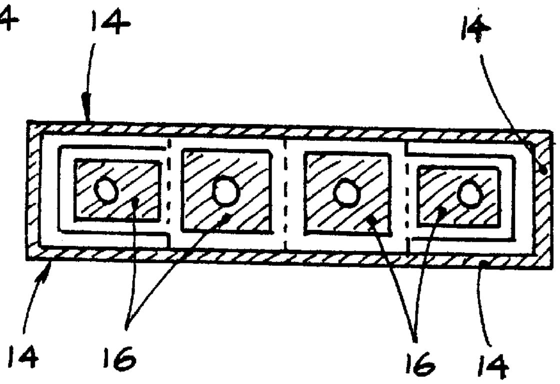
FIG. 85 is a top view of FIG. 83.
Figure 86:
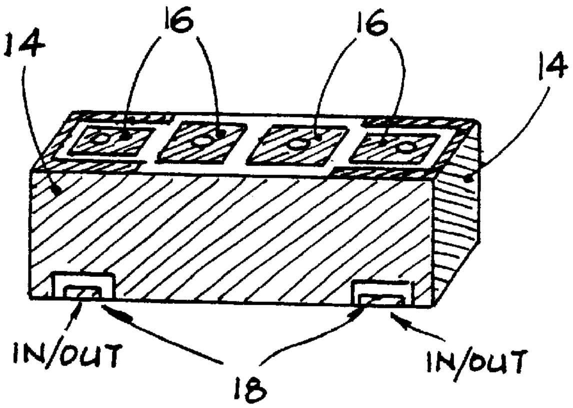
FIG. 86 is a three-dimensional top view of FIG. 83.
Figure 87:
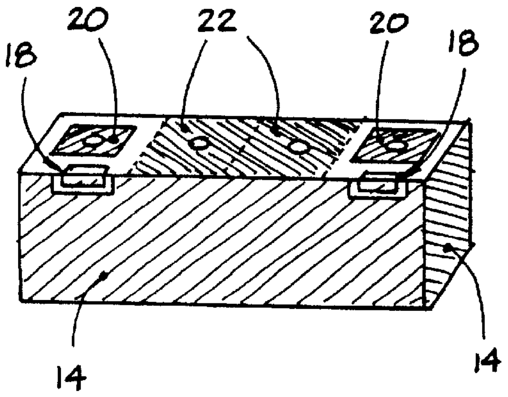
FIG. 87 is a three-dimensional bottom view of FIG. 83.
Figure 88:
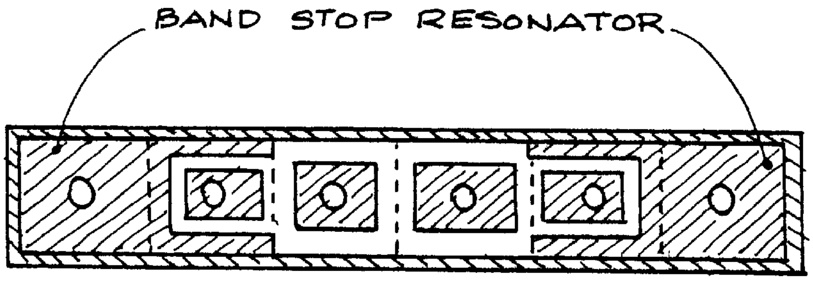
FIG. 88 is a schematic top view of a filter of coaxial resonators with coaxial resonators at the ends to improve Skirt response, where the filter employs electrode coupling to reverse resonator orientation in the filter according to present invention.
Figure 89:
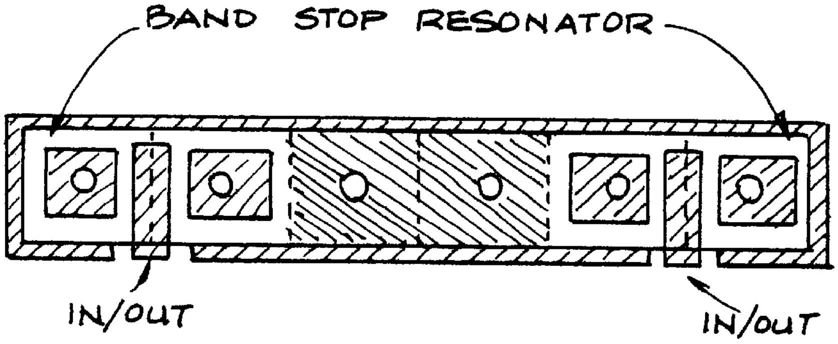
FIG. 89 is a schematic bottom view of FIG. 88.
Figure 90:
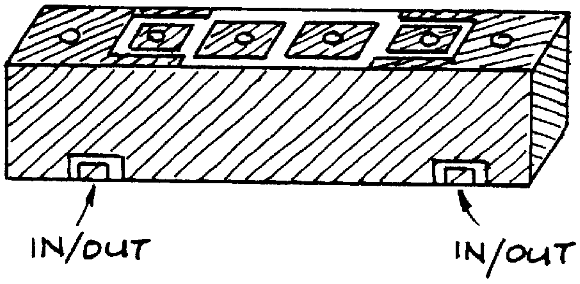
FIG. 90 is a three-dimensional top view of FIG. 88.
Figure 91:
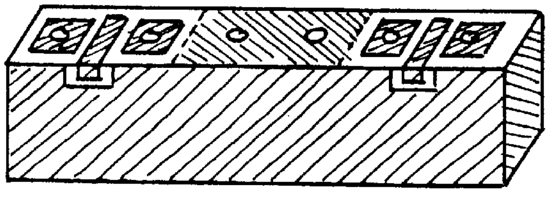
FIG. 91 is a three-dimensional bottom view of FIG. 88.
Figure 92:
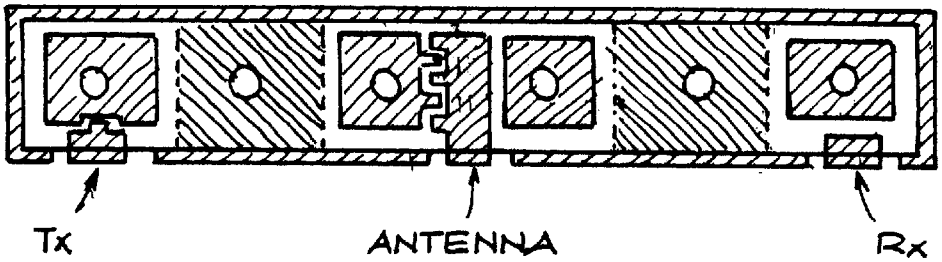
FIG. 92 is a schematic top view of a duplexer filter of coaxial resonators, where the filter employs electrode coupling to reverse resonator orientation in the filter according to present invention.
Figure 93:
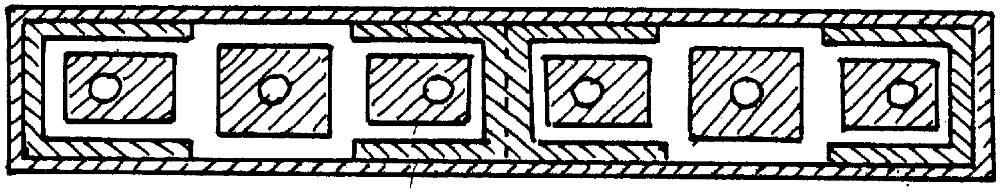
FIG. 93 is a schematic bottom view of FIG. 92.
Figure 94:
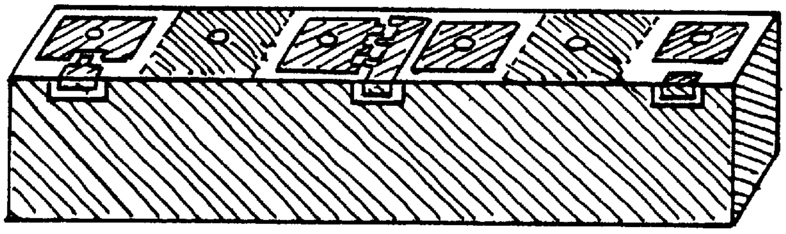
FIG. 94 is a three-dimensional top view of FIG. 92.
Figure 95:
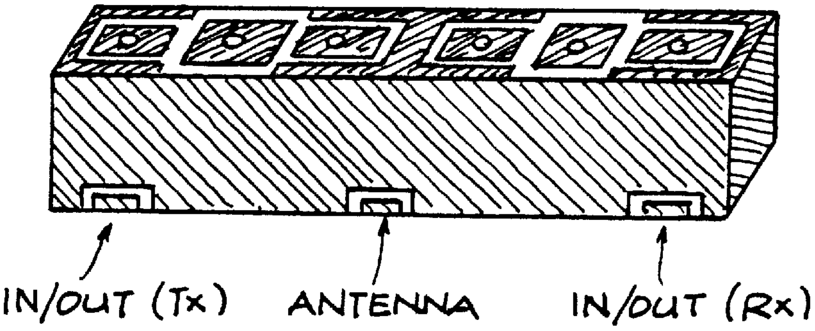
FIG. 95 is a three-dimensional bottom view of FIG. 92.

Another method of reversing orientation of the resonators is the positioning of the electrodes to providing an electronic reversing of resonator orientation, when employing electrode coupling. FIGS. 78 and 83, respectively, show a schematic of a three-pole filter 10 and.four-pole filter 12 made from a single block of material that employs electrode coupling. In FIGS. 78 and 83, coaxial type resonators are employ as examples, but other resonator types and combination of resonator types can be used. FIGS. 79, 80, 81, and 82 respectively show a top, bottom and three-dimensional views of FIG. 78. FIGS. 84, 85, 86, and 87 respectively show a top, bottom and three-dimensional views of FIG. 83. As for most filters, there is an outside electrode coating 14 on both filters 10 and 12, which acts similar to a ground. The top view of each filter 10, 12 show coupling electrodes 16, which provide electrode coupling between each resonator. The bottom view of each filter 10, 12 show input/output electrodes 18, coupling electrodes 20 and grounding electrode 22. The grounding electrode 22 covers the bottom of the resonator or resonators to be reversed. The input/output electrodes 18 and coupling electrodes 20 provide coupling between the input/output of a filter and the resonator to which the coupling electrode 20 is attached. The grounding of resonators between resonators that receive the input and output of a signal, as shown in FIGS. 78–87, changes the direction of the electrical field of the signal resonating through the filter. This changing of the direction of the electric field is similar to reversing the orientation of a resonator in a filter, as described above. As other examples which employ the reversing of resonators using the positioning of electrodes, FIGS. 88–91 and 92–95 respectively show views of four-pole filter with two band stop resonators and of a six-pole duplexer filter. FIGS. 49–64 show a monolithic single ceramic block with a mixture of reentrant resonators and coaxial resonators with top and bottom electrodes. The band pass filter of FIG. 49 and duplexer filters of FIGS. 57–61 also contain the orientation reversed resonators by positioning coupling electrodes similar to the filters made of all coaxial type resonators as shown in FIGS. 78–95.

While different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

I claim:

1. A dielectric filter made up of resonators, such that said filter resonates a design frequency, said filter comprising:

two identically same resonators coupled together between an input and an output; and at least one different resonator of a different design from said identically same resonators, such that said different resonator resonates the same design frequency as said identically same resonators and resonates different higher order harmonic frequencies than as said identically same resonators, therefore allowing only said design frequency to pass from said at least one different resonator to said identically said resonator connected to said output, wherein at least one of said resonators between said identically same resonators is reversed in orientation as compared to the other of said identically same resonators.

2. A dielectric filter made up of resonators, such that said filter resonates a design frequency, said filter comprising:

two identically same resonators coupled together between an input and an output; and at least one different resonator of a different design from said identically same resonators, such that said different resonator resonates the same design frequency as said identically same resonators and resonates different higher order harmonic frequencies than as said identically same resonators, therefore allowing only said design frequency to pass from said at least one different resonator to said identically said resonator connected to said output;

wherein there are at least three resonators coupled together as two outside resonators and a middle resonator of at least one resonator between said outside resonators; wherein a first resonator of said outside resonators is connected to an input; wherein a last resonator of said outside resonators is connected to an output; and wherein said middle resonator is of said different design from said first and last third resonators; and wherein at least one of said middle resonators is reversed in orientation as compared to the other of said resonators.

3. The dielectric filter of claim 2, wherein at least one of said middle resonators is reversed in orientation electronically by employing electrode coupling on a top and bottom surface of said filter.

4. The dielectric filter of claim 3, wherein said filter is formed from a single block of dielectric material and includes a top, bottom and sides; wherein said sides are covered by and interconnected by an electrode coating which acts as a ground; wherein said top includes coupling electrodes on each resonator which allows electrode coupling between each resonator; wherein said bottom includes an input electrode on said first resonator of said outside resonators, a coupling electrode on said first resonator of said outside resonators, an output electrode on said last resonator of said outside resonators, a coupling electrode on said last resonator of said outside resonators, and a grounding electrode covering at least one of said middle resonators that is interconnected to said electrode coating of said sides for grounding; and wherein said positioning of said input electrode, output electrode, coupling electrodes, grounding electrodes and electrode coating of said sides effect an electronic reversing of the orientation of at least one middle resonator.

5. A dielectric filter made up of resonators, such that said filter resonates a design frequency, said filter comprising:

at least two resonators coupled together between an input and an output; and at least one of said resonators being of a different design from other resonators of said at least two resonators, such that said resonator of a different design resonates the same design frequency as said other resonators and resonates different higher order harmonic frequencies than as said other resonators;

wherein there are at least three resonators coupled together as two outside resonators and a middle resonator of at least one resonator between said outside resonators; wherein a first resonator of said outside resonators is connected to an input; wherein a last resonator of said outside resonators is connected to an output; and wherein said middle resonator is of said different design from said first and last third resonators; and wherein there are at least two middle resonators between said first and last resonators.

6. The dielectric filter of claim 5, wherein both of said middle resonators are of said different design from said first and last third resonators.

7. The dielectric filter of claim 5, wherein an electrode is mounted to each of said first and last resonators for each of said input and output and wherein electrode coupling is employed between said electrodes and said first and last resonators.

8. The dielectric filter of claim 5, wherein said first and last resonators each include an additional resonator coupled to the outside of said first and last resonators to improve skirt response.

9. The dielectric filter of claim 5, wherein at least one of said middle resonators is reversed in orientation as compared to the other of said resonators.

10. A duplexer dielectric filter for a device comprising an antenna connection for said filter that serves as an input and output to said device via said filter;

an output connection that serves as a connection from said device to said filter;

an input connection that serves as a connection to said device from said filter; and a first set of a first, last and at least two middle resonators coupled together between said input and antenna connections and a second set of a first, last and at least two middle resonators between said output and antenna connections, and wherein at least one of said two middle resonators of said first and second sets being of a different design from other resonators of said first and second sets, such that said resonator of a different design resonates the same design frequency as said other resonators of said first and second sets and resonates different higher order harmonic frequencies than as said other resonators of said first and second sets.

11. The dielectric filter of claim 10, wherein both of said middle resonators are of said different design from said first and last third resonators for each said first and second sets.

12. The dielectric filter of claim 10, wherein an electrode is mounted as said input; wherein an electrode is mounted as said output; wherein an electrode is mounted as said antenna; and wherein electrode coupling is employed between said electrodes and said resonators.

13. The dielectric filter of claim 10, wherein said resonators connect to each of said input and output each include an additional resonator coupled to the outside of said resonators to improve skirt response.

14. A duplexer dielectric filter for a device comprising an antenna connection for said filter that serves as an input and output to a device via said filter;

an output connection that serves as a connection from said device to said filter;

an input connection that serves as a connection to said device from said filter; and a first set of at least two identically same resonators coupled together between said input and antenna connections and a second set of at least two identically same resonators coupled together between said output and antenna connections, and wherein there is at least one resonator between said two identically same resonators of said first and second sets being of a different design from other resonators of said first and second sets, such that said resonator of a different design resonates the same design frequency as said other resonators of said first and second sets and test resonates different higher order harmonic frequencies than as said other resonators of said first and second sets and wherein at least one of said resonators between said identically same resonators is reversed in orientation as compared to the other of said identically same resonators.

* * * * *